United States Patent
Kajigaya

(10) Patent No.: US 9,214,218 B2
(45) Date of Patent: Dec. 15, 2015

(54) SEMICONDUCTOR DRAM WITH NON-LINEAR WORD LINE DISCHARGE

(75) Inventor: Kazuhiko Kajigaya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 908 days.

(21) Appl. No.: 13/420,345

(22) Filed: Mar. 14, 2012

(65) Prior Publication Data

US 2012/0236673 A1 Sep. 20, 2012

(30) Foreign Application Priority Data

Mar. 14, 2011 (JP) .................................. 2011-054944

(51) Int. Cl.
*G11C 8/08* (2006.01)
*G11C 11/408* (2006.01)
*G11C 11/4094* (2006.01)
*G11C 11/4097* (2006.01)

(52) U.S. Cl.
CPC .............. *G11C 11/4085* (2013.01); *G11C 8/08* (2013.01); *G11C 11/4094* (2013.01); *G11C 11/4097* (2013.01)

(58) Field of Classification Search
CPC ................................ G11C 8/08; G11C 11/4085
See application file for complete search history.

(56) References Cited

U.S. PATENT DOCUMENTS

| | | | |
|---|---|---|---|
| 5,297,104 A | 3/1994 | Nakashima | |
| 6,002,635 A * | 12/1999 | Matano | ..................... 365/230.06 |
| 6,046,956 A | 4/2000 | Yabe | |
| 6,262,934 B1 | 7/2001 | Uehara | |
| 6,545,923 B2 | 4/2003 | Sim et al. | |
| 6,628,564 B1 * | 9/2003 | Takita et al. | .............. 365/230.06 |
| 6,650,590 B2 * | 11/2003 | Inaba et al. | .................... 365/226 |
| 6,661,734 B2 | 12/2003 | Inaba et al. | |
| 6,751,782 B2 * | 6/2004 | Levin et al. | ...................... 326/87 |
| 6,826,074 B2 * | 11/2004 | Yamauchi | ...................... 365/154 |
| 7,082,048 B2 | 7/2006 | Choi | |
| 7,203,125 B2 * | 4/2007 | Fujima | ..................... 365/230.06 |
| 7,324,390 B2 | 1/2008 | Choi | |
| 7,839,701 B2 | 11/2010 | Choi | |
| 2010/0061175 A1 | 3/2010 | Kim | |

FOREIGN PATENT DOCUMENTS

| | | |
|---|---|---|
| JP | 5-89673 A | 4/1993 |
| JP | 10-241361 A | 9/1998 |

(Continued)

OTHER PUBLICATIONS

Harris, Introduction to CMOS VLSI Design, "Lecture 4: DC & Transient Response," Harvey Mudd College, Spring 2004, [Retrieved on Apr. 20, 2015]. Retrieved from the Internet <URL: http://oxent.ic.unicamp.br/sites/oxent.ic.unicamp.br/files/lect4.pdf>.*

*Primary Examiner* — Harry W Byrne
*Assistant Examiner* — Lance Reidlinger

(57) ABSTRACT

Disclosed herein a device that includes a memory cell array including plurality of word lines, a plurality of bit lines each intersecting the word lines and a plurality of memory cells each disposed at an associated one of intersections of the word and bit lines, and the device further includes a driver configured to drive a selected one of the word lines from an inactive level to an active and to drive the selected one of the word lines from the active level to an intermediate level at a first rate and from the intermediated level to the inactive level at a second rate. The intermediate level is between the active and inactive levels, and the first rate is greater than the second rate.

8 Claims, 23 Drawing Sheets

(56) References Cited

FOREIGN PATENT DOCUMENTS

| | | |
|---|---|---|
| JP | 11-31384 A | 2/1999 |
| JP | 11-86543 A | 3/1999 |
| JP | 11-328953 A | 11/1999 |
| JP | 2000-36191 A | 2/2000 |
| JP | 2000-36193 A | 2/2000 |
| JP | 2001-126473 A | 5/2001 |
| JP | 2002-298579 A | 10/2002 |
| JP | 2002-352580 A | 12/2002 |
| JP | 2003-30984 A | 1/2003 |
| JP | 2007-504594 A | 3/2007 |
| JP | 2010-67337 A | 3/2010 |
| WO | WO 2005/024834 A2 | 3/2005 |

* cited by examiner

SEMICONDUCTOR DRAM WITH NON-LINEAR WORD LINE DISCHARGE

BACKGROUND OF THE INVENTION

1. Field of the Invention

This application is based upon and claims the benefit of the priority of Japanese patent application No. 2011-054944, filed on Mar. 14, 2011, the disclosure of which is incorporated herein in its entirety by reference thereto.

The present invention relates to a semiconductor device having a memory cell.

2. Description of Related Art

In a semiconductor device such as a DRAM (Dynamic Random Access Memory), due to miniaturization of processing sizes, i.e., decrease in bit line pitch and word line pitch, trench gate structure in which a gate electrode is embedded in a Si substrate is employed in order to reduce off-current of a memory cell selecting transistor.

Further, as a method for controlling a word line in a DRAM, in order to prevent a current load of a negative potential power supply from increasing due to a reset current to a word line, a method is known, in which once a word line potential is discharged to an intermediate potential such as a ground potential at a time of resetting the word line and then the word line potential is discharged to a negative potential, which is the reset potential (for instance, refer to Patent Documents 1 to 10).

[Patent Document 1]
Japanese Patent Kokai Publication No. JP-A-H05-89673, which corresponds to U.S. Pat. No. 5,297,104.
[Patent Document 2]
Japanese Patent Kokai Publication No. JP-A-H10-241361, which corresponds to U.S. Pat. No. 6,046,956.
[Patent Document 3]
Japanese Patent Kokai Publication No. JP-A-H11-31384
[Patent Document 4]
Japanese Patent Kokai Publication No. JP-A-H11-328953
[Patent Document 5]
Japanese Patent Kokai Publication No. JP2001-126473A, which corresponds to U.S. Pat. No. 6,262,934B1.
[Patent Document 6]
Japanese Patent Kokai Publication No. JP2002-352580A, which corresponds to U.S. Pat. No. 6,545,923B2.
[Patent Document 7]
Japanese Patent Kohyo Publication No. JP2007-504594A, which corresponds to U.S. Pat. No. 7,839,701B2, U.S. Pat. No. 7,324,390B2 and U.S. Pat. No. 7,082,048B2.
[Patent Document 8]
Japanese Patent Kokai Publication No. JP2010-67337A, which corresponds to US2010/061175A1.
[Patent Document 9]
Japanese Patent Kokai Publication No. JP2000-36191A
[Patent Document 10]
Japanese Patent Kokai Publication No. JP2003-30984A, which corresponds to U.S. Pat. No. 6,661,734B2.

SUMMARY

The disclosures of the above Patent Documents are incorporated herein in their entirety by reference thereto. The following analysis is given from the standpoint of the present invention.

With regard to a semiconductor device, a charge pumping effect is known, in which minority carriers are injected into a substrate when a MOS transistor is cut off. When a select transistor has an nMOS structure, the substrate generally has a p-well structure, and electrons, which are minority carriers, are injected into the p-well due to the charge pumping effect. A current Ie caused by these electrons is generally expressed by the following formula 1.

[Formula 1]

$$Ie = A \cdot f \cdot \alpha \cdot C \cdot (Vg - Vt) \quad (1)$$

Here, A denotes gate area; f denotes charge pumping frequency (at which a word line turns on/off); $\alpha$ denotes pumping efficiency; C denotes gate capacitance per unit area; Vg denotes on-voltage of a word line; and Vt denotes threshold voltage of a select transistor.

It is known that the pumping efficiency $\alpha$ increases as the channel length increases, as the amplitude of the word line increases, and as the slope of the reset waveform of the word line becomes steeper. Due to the employment of a trench gate as a countermeasure to the miniaturization of the processing sizes of a DRAM, the gate area A and the channel length increase, thereby increasing the pumping efficiency $\alpha$. As a result, the charge pump current Ie has a tendency to increase.

Further, most of the electrons, which are the minority carriers injected into the p-well, normally recombine with positive holes and disappear. However, when a distance between neighboring memory cells is reduced, the electrons diffuse and reach a neighboring memory cell without recombination, increasing the probability that the electrons may damage the high information of the neighboring memory cell.

In the arts described in Patent Documents 1 to 8, since a power supply wiring for an intermediate potential in a sub-word line driver is required, there is a problem of an increase in the area of the sub-word line driver. Further, in the arts described in Patent Documents 9 and 10 a power supply wiring for an intermediate potential is required for a driver circuit that supplies the high-potential power supply of a sub-word line driver, there is a problem of an increase in the area of a cross area (where a sense amplifier region and a sub-word line driver region intersect) in an array area. Further, when a ground potential is used as the intermediate potential, there is a problem that a degree of freedom in designing the reset waveform of the word line for effectively decreasing the pumping efficiency $\alpha$ is reduced.

In a first aspect, there is provided a semiconductor device that comprises first and second memory cell arrays arranged side by side in a first direction, each of the first and the second memory cell arrays comprising a memory cell mat that includes a word line and a bit line, a sub-word driver circuit that drives the word line, and a first control unit that controls the sub-word driver circuit. The semiconductor device further comprises a first region that is disposed between the first memory cell array and the second memory cell array and that includes a second control unit that controls the sub-word driver circuit. The first control unit has a first circuit unit. The second control unit includes a third circuit unit that operates at a first power supply voltage having a first power supply potential as a low potential side and a fourth circuit unit that operates at a second power supply voltage having a second power supply potential lower than the first power supply potential as a low potential side. The second control unit supplies a first control signal to the sub-word driver circuit, and supplies a second control signal to the first circuit unit of the first control unit. The first circuit unit of the first control unit operates at a third power supply voltage having the second power supply potential as a low potential side without receiving the first power supply potential, receives the second control signal, and supplies a third control signal to the sub-word driver circuit. The sub-word driver circuit receives the first control signal and the third control signal, and nonlinearly deactivates the word line of an active state.

In a second aspect, there is provided a device that comprises: a memory cell array including a plurality of word lines, a plurality of bit lines each intersecting the word lines and a plurality of memory cells each disposed at an associated one of intersections of the word and bit lines; and a driver configured to drive a selected one of the word lines from an inactive level to an active, the driver being further configured to drive the selected one of the word lines from the active level to an intermediate level at a first rate and from the intermediated level to the inactive level at a second rate, the intermediate level being between the active and inactive levels, and the first rate being greater than the second rate.

In a third aspect, there is provided a device that comprises: a memory cell array including a plurality of word lines, a plurality of bit lines each intersecting the word lines and a plurality of memory cells each disposed at an associated one of intersections of the word and bit lines, each of the memory cells including a capacitor and a cell transistor connected in series between an associated one of the bit lines and a plate potential line, the cell transistor including a gate connected to an associated one of the word line; a driver circuit including a plurality of driver units each provided for an associated one of the word lines, each of the driver units including a first transistor connected between a first circuit node and the associated one of the word lines and a second transistor connected between the associated one of the word lines and a second node; and a control circuit configured to control each of the driver units to drive the associated one of the word lines from a selection level to an intermediate level at a first rate and from the intermediated level to a non-selection level at a second rate, the intermediate level being between the selection and non-selection levels, and the first rate being greater than the second rate.

The present disclosure provides at least one of the following effects.

Deactivation of a word line is performed nonlinearly, and a pumping efficiency α may be set to a value different from that in linear deactivation. As a result, information of a memory cell surrounding a word line may be protected from being damaged by minority carriers occurring in a semiconductor substrate during the deactivation of the word line.

BRIEF DESCRIPTION OF THE DRAWINGS

The above features and advantages of the present disclosure will be more apparent from the following description of certain preferred exemplary embodiments taken in conjunction with the accompanying drawings, in which.

The disclosure will be now described herein with reference to illustrative exemplary embodiments. Those skilled in the art will recognize that many alternative exemplary embodiments can be accomplished using the teachings of the present disclosure and that the disclosure is not limited to the exemplary embodiments illustrated for explanatory purposes.

A semiconductor device according to a first exemplary embodiment of the present disclosure will be described. The explanation below will be made using a dynamic access random memory (referred to as "DRAM" hereinafter) as an example of a semiconductor device. Further, in the explanation of the drawings below, the same symbols are given to the same elements in all exemplary embodiments.

Figure 1:
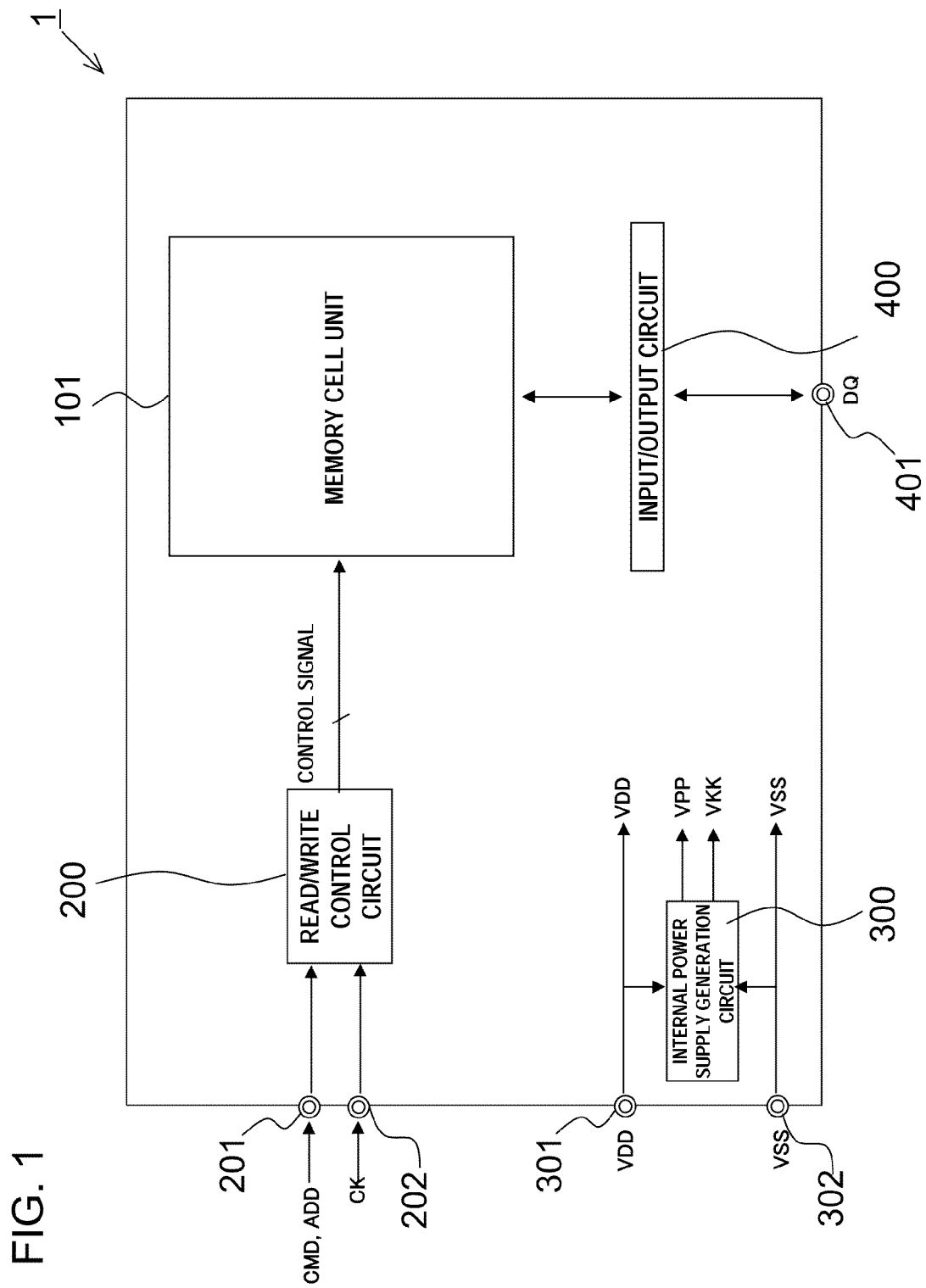
FIG. 1 is a schematic block diagram of a semiconductor device according to a first exemplary embodiment of the present disclosure.

FIG. 1 shows a schematic block diagram of the semiconductor device according to the first exemplary embodiment of the present disclosure. The semiconductor device 1 has at least one memory cell unit 101, a read/write control circuit 200 that controls reading and writing data from and to the memory cell unit 101, an internal power supply generation circuit 300 that generates a potential of a signal controlling the memory cell unit 101, and an input/output circuit 400 that controls inputting/outputting data to/from the memory cell unit 101. The read/write control circuit 200 is electrically connected to a command terminal 201 that receives a command signal and to a clock terminal 202 that receives a clock signal. The read/write control circuit 200 has a word line driving circuit described later and a circuit that controls the word line driving circuit. The internal power supply generation circuit 300 is electrically connected to a power supply terminal 301 connected to a power supply potential and a ground terminal 302 connected to a ground potential. The input/output circuit 400 is electrically connected to a signal terminal 401 that receives and outputs a data signal.

Figure 2:
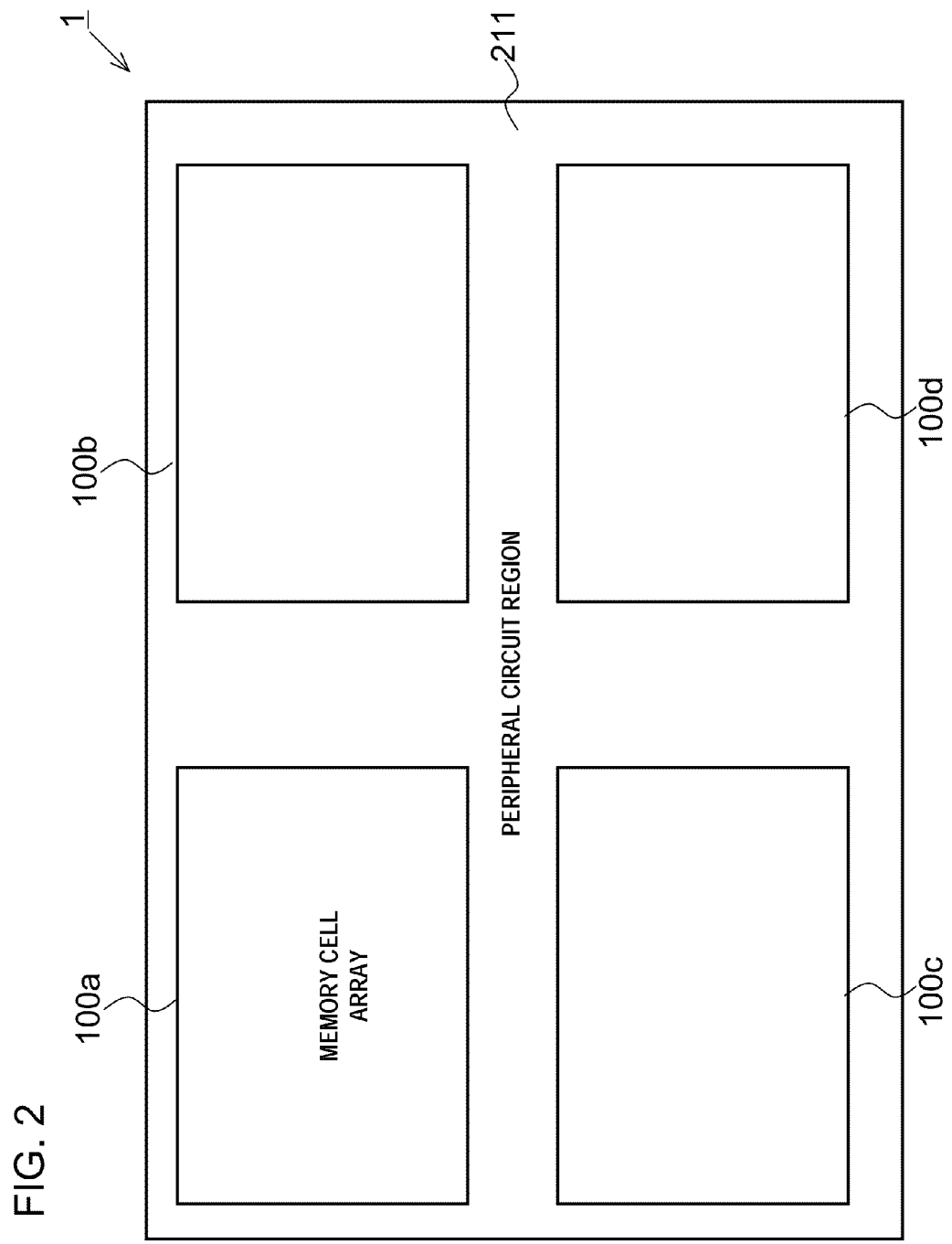
FIG. 2 is a schematic block diagram of a semiconductor device in which a plurality of the memory cell arrays shown in FIG. 1 are arranged.

FIG. 2 shows a schematic block diagram of the semiconductor device in which a plurality of memory cell arrays having a memory cell unit are arranged. FIG. 1 focuses on a single memory cell unit 101 and the accompanying circuits 200, 300, and 400, and FIG. 2 focuses on the arrangement of the plurality of memory cell arrays 100a to 100d. The semiconductor device 1 comprises the first to the fourth memory cell arrays 100a to 100d and a peripheral circuit region (first region) 211 formed in regions between the memory cell arrays 100a to 100d (regions surrounding the memory cell arrays 100a to 100d). The first to the fourth memory cell arrays 100a to 100d are arranged in a grid pattern. A part of the read/write control circuit 200 is disposed in the peripheral circuit region 211.

Figure 3:
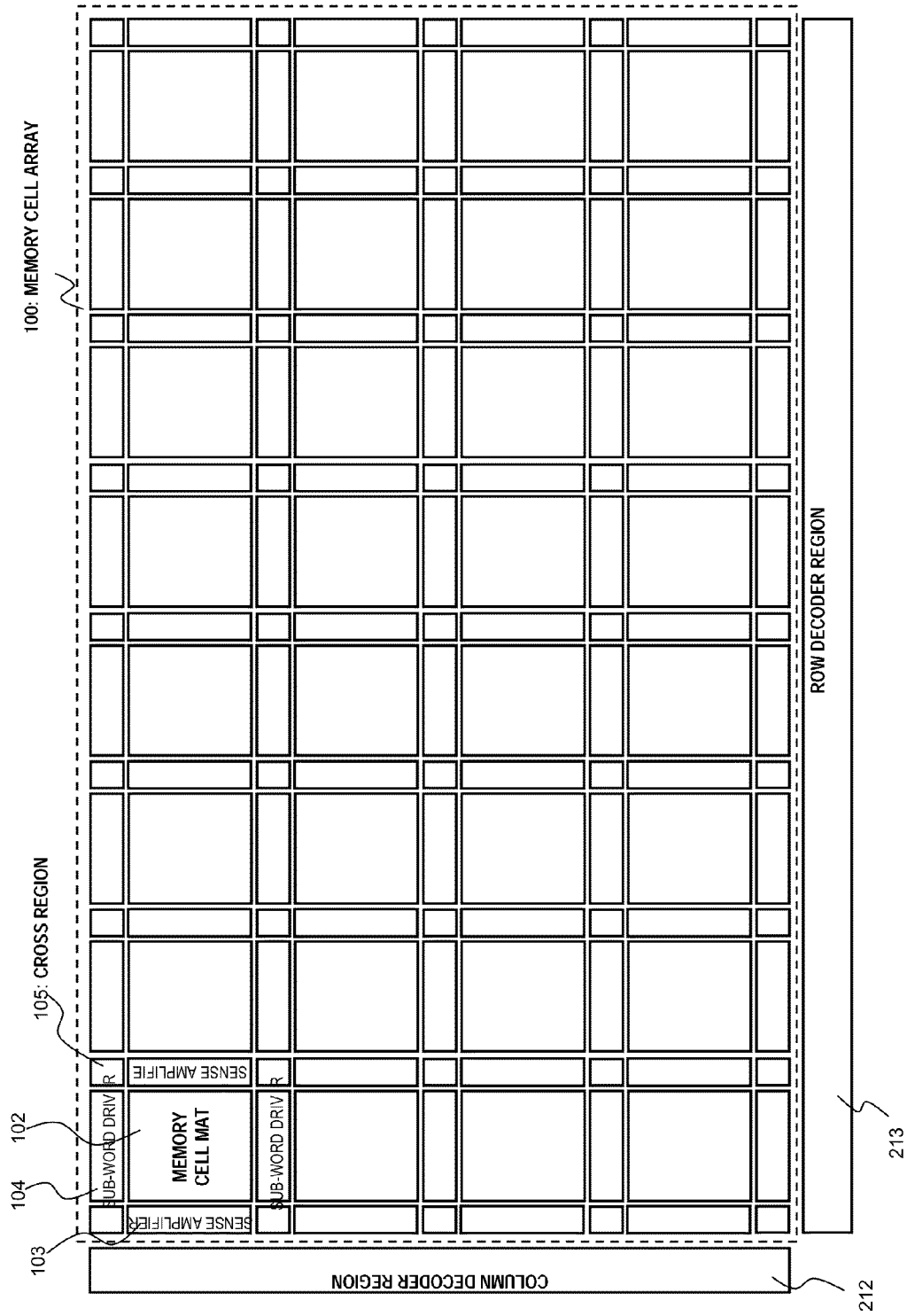
FIG. 3 is a schematic block diagram illustrating the inside of the memory cell array shown in FIGS. 1 and 2.

FIG. 3 shows a schematic block diagram illustrating the inside of the memory cell array shown in FIGS. 1 and 2. In a mode shown in FIG. 3, the semiconductor device 1 has the memory cell array 100, and a column decoder region 212 and a row decoder region 213 where decoders for the memory cell array are formed. The memory cell array 100 comprises a plurality of memory cell mats 102 having a plurality of memory cells, a plurality of sense amplifier regions 103 formed between adjacent memory cell mats 102 in the horizontal direction in the drawing, a plurality of sub-word driver regions 104 formed between adjacent memory cell mats 102 in the vertical direction in the drawing, and a plurality of cross regions 105 formed between adjacent memory cell mats 102 in the diagonal direction in the drawing. The cross region 105 is formed not only between adjacent sense amplifier regions 103, but also between adjacent sub-word driver regions 104.

Figure 4:
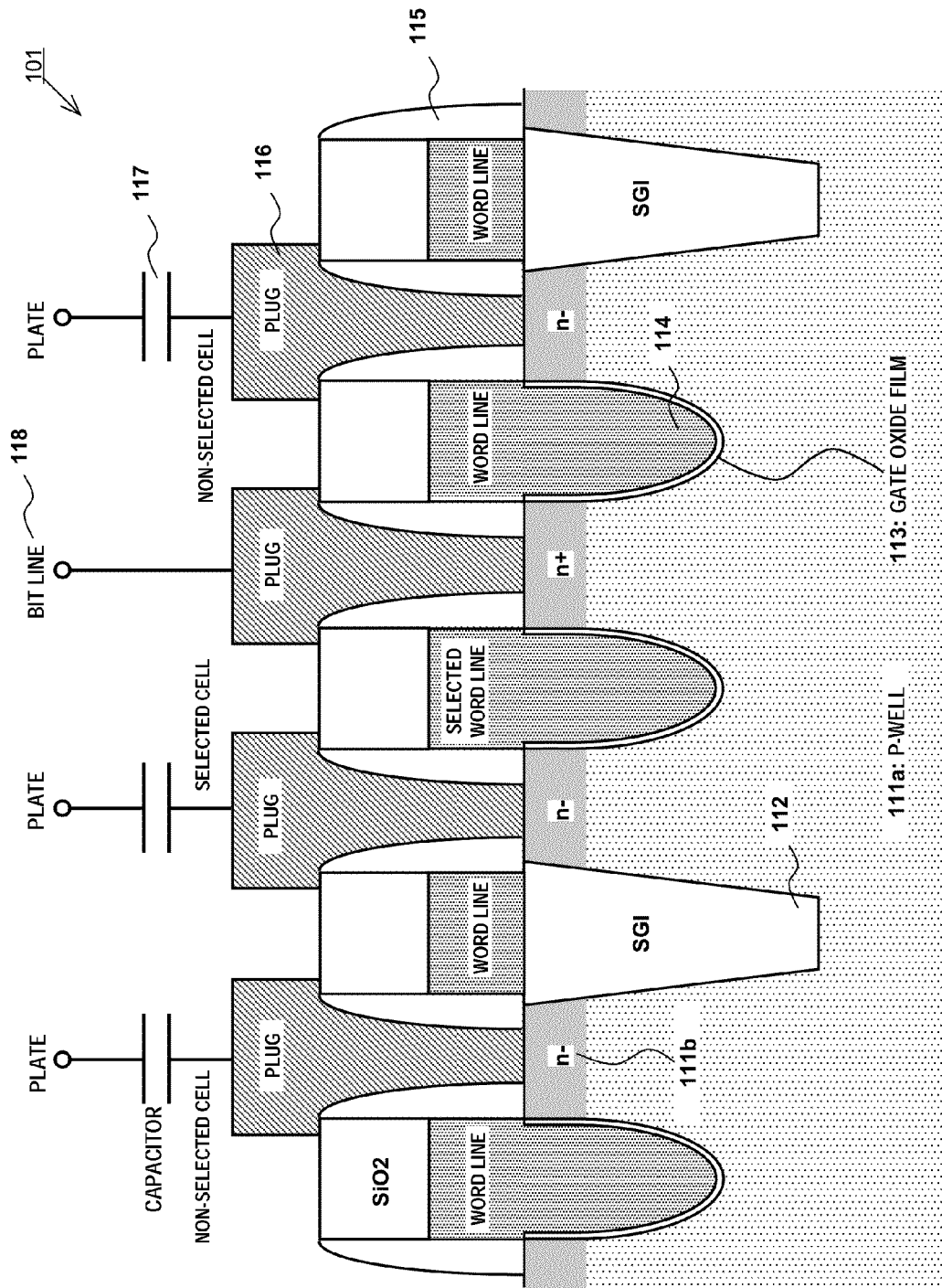
FIG. 4 is a schematic cross-section of a memory cell selecting transistor in a memory cell array.

FIG. 4 shows a schematic cross-section of a memory cell selecting transistor in the memory cell array. FIG. 4 is a schematic cross-section of a trench-gate-type cell transistor (for instance, nMOS transistor) having a gate electrode embedded in a semiconductor substrate. The memory cell array 100 has a semiconductor substrate 111 (for instance, p-well), an element isolation region 112 (SGI; Shallow Groove Isolation), a gate oxide film 113 formed so as to cover a groove formed on the semiconductor substrate 111, a gate electrode 114 (word line) formed on the gate oxide film 113 and embedded in the groove, a protective film 115 covering the side and top of the word line 114, a plug 116, a capacitor 117, and a bit line 118. The semiconductor substrate 111 is, for instance, a silicon substrate and has a p-well 111a and source/drain regions 111b formed by implanting an n-type impurity into the p-well 111a. The plugs 116 are electrically connected to the source/drain regions 111b. The capacitor 117 and the bit line 118 are electrically connected to the plugs 116.

According to the present disclosure, the information of memory cells surrounding a selected word line is protected from being damaged by minority carriers occurring in the semiconductor substrate 111 upon deactivation of the word line.

Figure 5:
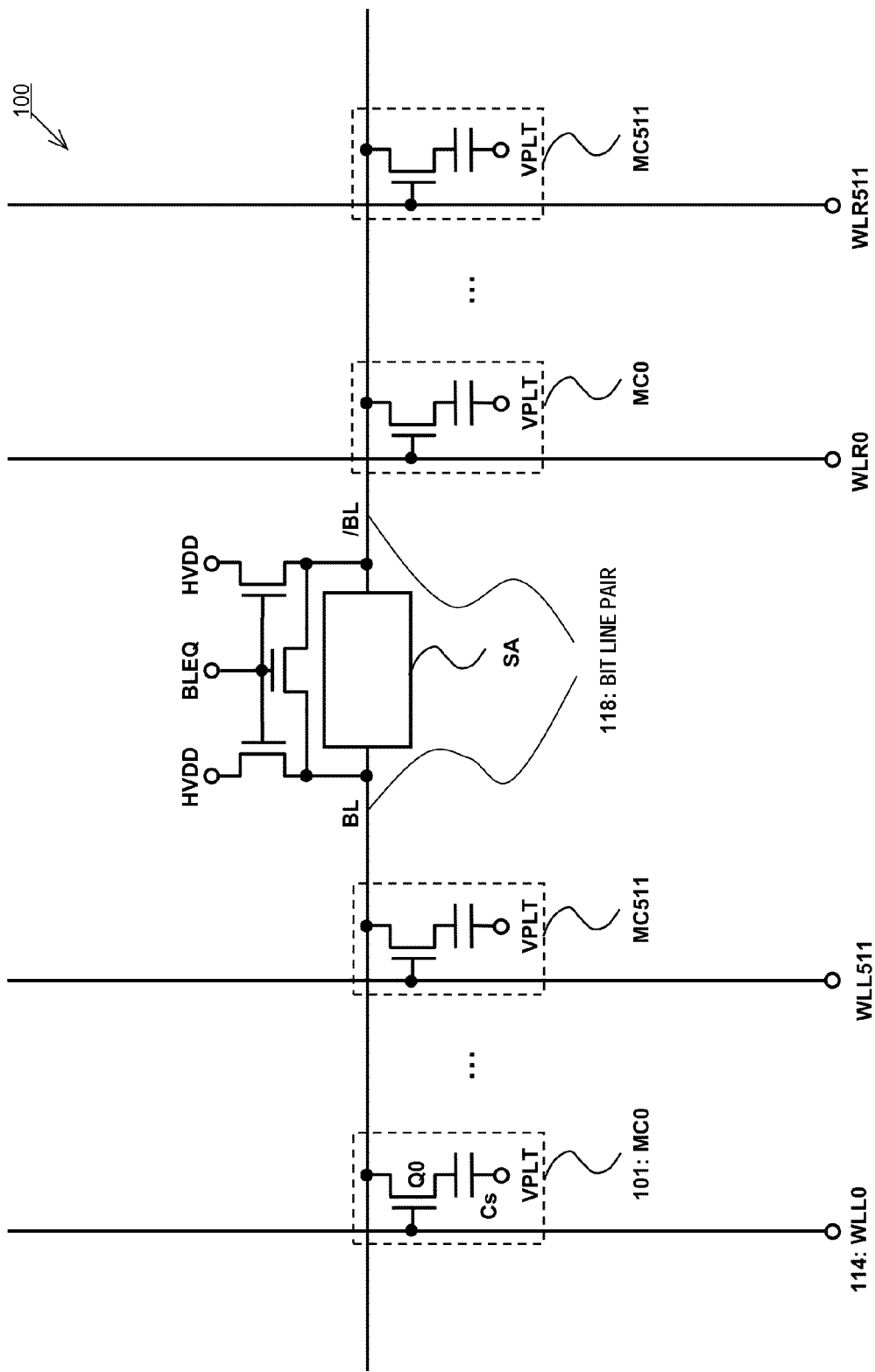
FIG. 5 is a circuit diagram illustrating an example of a memory cell array circuit.

FIG. 5 shows a circuit diagram illustrating an example of the memory cell array circuit in the semiconductor device of the present disclosure. The memory cell array 100 has a sense amplifier circuit SA, a pair of complementary bit lines BL and /BL connected to two input/output terminals of the sense amplifier circuit SA, a plurality of DRAM memory cells MC (512 cells in FIG. 5) connected to each of the complementary bit lines BL and /BL, and an equalizing circuit connected to the complementary bit line pair BL and /BL. Each DRAM memory cell MC has a select transistor Q0 and a capacitor Cs. When a bit line equalizing signal BLEQ is driven to a high level in the equalizing circuit, the pair of the complementary bit lines BL and /BL are equalized to a precharge potential HVDD.

Figure 6:
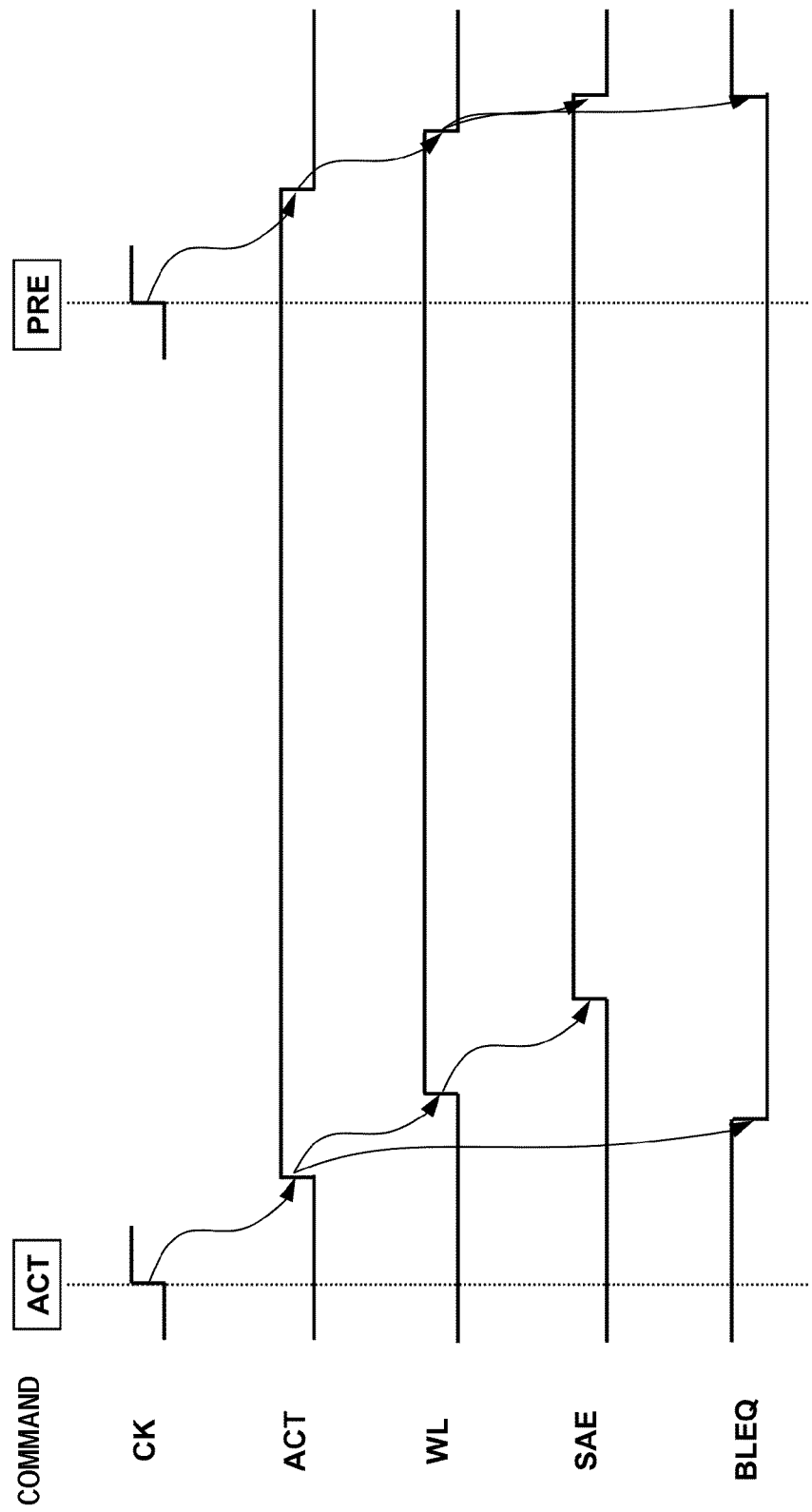
FIG. 6 is a schematic drawing showing an example of a flow of a control signal during active operation of a DRAM in a semiconductor device of the present disclosure.

FIG. 6 is a schematic drawing showing an example of the flow of a control signal during active operation of the DRAM in the semiconductor device of the present disclosure. First, an active command signal ACT externally supplied via the command terminal 201 is taken into the semiconductor device 1 in synchronization with a rising edge of an external clock signal CK externally supplied via the clock terminal 202. Next, the read/write control circuit 200 activates the control signal (the internal active signal) ACT at a predetermined timing. Further, the read/write control circuit 200 deactivates the control signal (the bit line equalize signal) BLEQ after activating the internal active signal. Out of a plurality of word lines WL in the memory cell array 100, a word line WL corresponding to a row address externally supplied along with the active command signal ACT is activated by the activation of the internal active signal ACT, the memory cell MC is selected, and a signal is read to the bit line. Further, after a predetermined time has elapsed after the activation of the word line WL, the read/write control circuit 200 activates a control signal (sense amplifier activation signal) SAE, thereby starting the sense amplifier SA. Then, according to a column address of a read command signal or write command signal supplied in synchronization with the external clock signal CK, the read/write control circuit 200 selects a bit line corresponding to the column address from the plurality of bit lines in the memory cell array 100, and a read operation or write operation is performed on the memory cell MC connected to the activated word line out of the plurality of memory cells MC connected to the bit line corresponding to the column address.

Next, when a precharge command signal PRE externally supplied via the command terminal 201 is taken into the semiconductor device 1 in synchronization with a rising edge of an external clock signal CK externally supplied via the clock terminal 202, the read/write control circuit 200 deactivates the internal active signal ACT at a predetermined timing. Then, the activated word line WL in the memory cell array 100 is deactivated. Further, after a predetermined time has elapsed after the deactivation of the word line WL, the read/write control circuit 200 deactivates the sense amplifier activation signal SAE and activates the control signal (the bit line equalize signal) BLEQ, thereby starting equalization of the bit lines. A series of an active operation is completed as described above.

Figure 7:
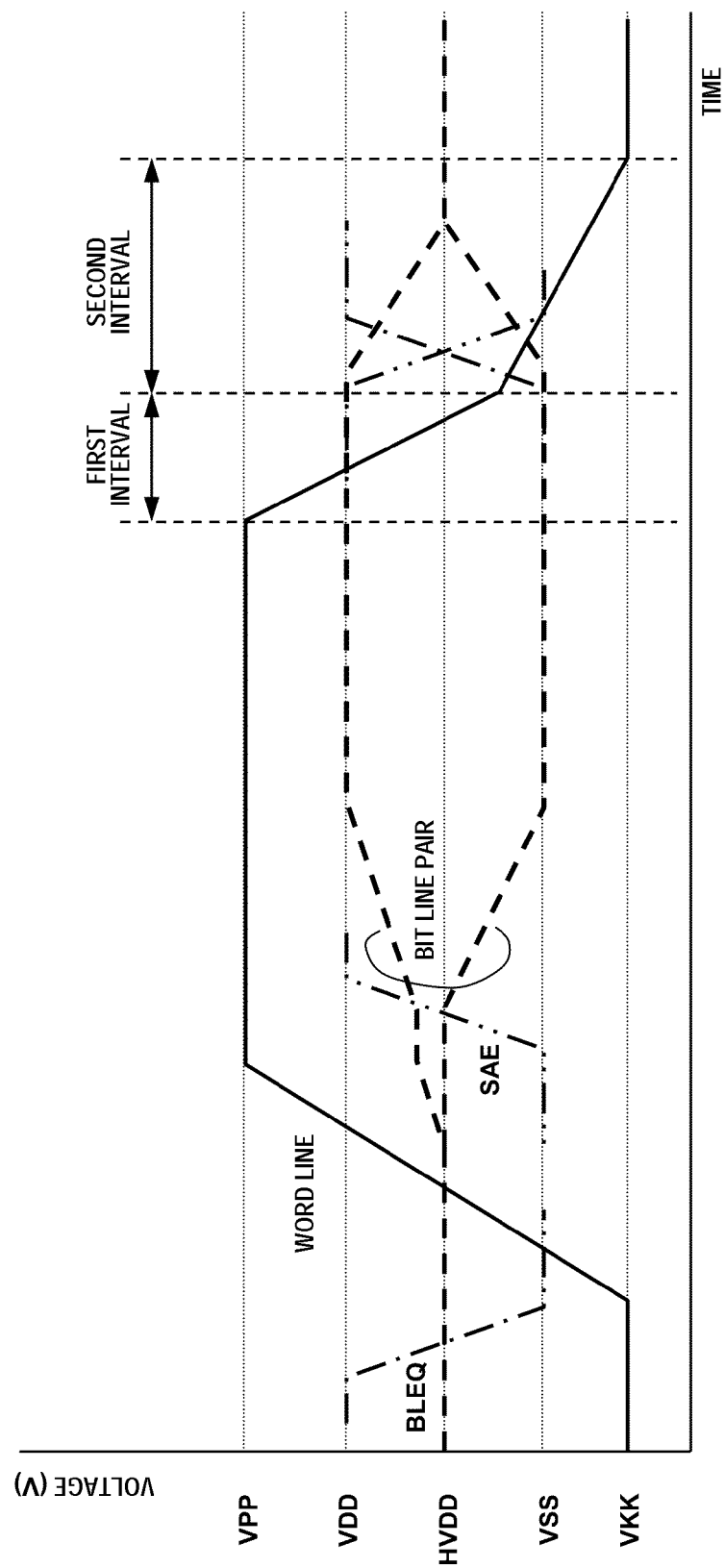
FIG. 7 is a schematic diagram showing an example of waveforms of a word line and a bit line pair in semiconductor devices according to first to fifth exemplary embodiments of the present disclosure.

FIG. 7 is a schematic diagram showing an example of waveforms of the word line and the bit line pair in the semiconductor device according to the first to fifth exemplary embodiments of the present disclosure. First, when the active command signal is received, the bit line equalizing signal BLEQ is driven to a low level. Then, the word line rises, and a small signal is read to the complementary bit line pair. Next, when the sense amplifier activation signal SAE is driven to a high level, the sense amplifier SA amplifies one of the complementary bit line pair to the power supply potential VDD and the other bit line to the ground potential VSS.

Next, when the precharge command signal is received, the word line WL is reset. At this time, the word line WL is deactivated nonlinearly. When an initial interval after the start of the deactivation of the word line is called "the first interval" and an interval after the first interval until termination of the deactivation of the word line WL is called "the second interval," the deactivation speed in the first interval is faster than that in the second interval. Because of this, the pumping efficiency α in the formula 1 can be reduced. As a result, the number of electrons, which are minority carriers, injected into the p-well can be reduced, and the high information of memory cells surrounding a selected word line can be protected from being damaged.

Further, since only one type of the power supply potential is needed for deactivating the word line WL, a power supply wiring for an intermediate potential becomes unnecessary. As a result, an increase in the area of the memory cell array can be suppressed. Further, the degree of freedom in designing the deactivation waveform can be increased.

Further, the equalization of the complementary bit line pair starts during the second interval. At this time, since the potential of the word line WL has been decreased during the first interval before the equalization of the complementary bit line pair, the information of memory cells will not get damaged by the equalization of the complementary bit line pair. As a result, the equalization of the complementary bit line pair can be started at the beginning of the second interval, and the extension of the precharge period can be avoided.

Figure 8:
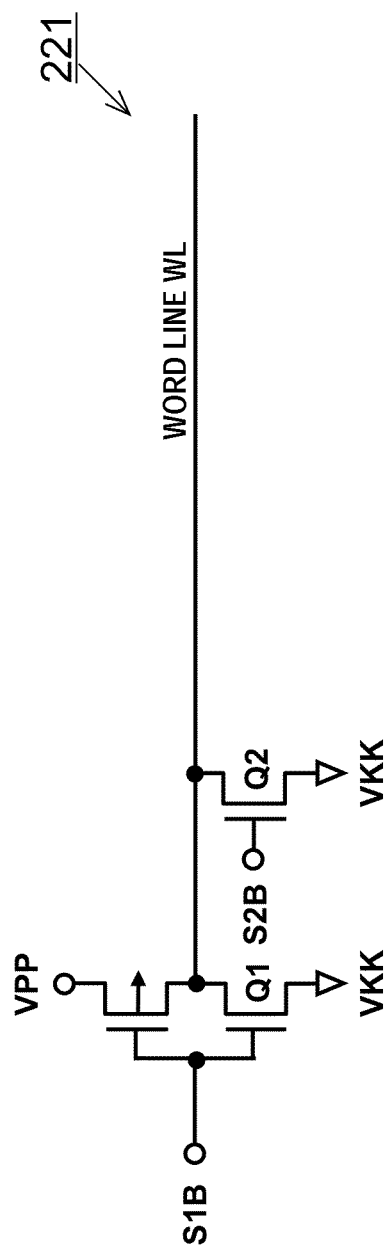
FIG. 8 is a circuit diagram showing an example of a first word line driving circuit in the semiconductor device according to the first exemplary embodiment of the present disclosure.

FIG. 8 is a circuit diagram showing an example of a first word line driving circuit in the semiconductor device of the present disclosure. The first word line driving circuit 221 shown in FIG. 8 is of the CMOS type and has the most basic configuration.

The first word line driving circuit 221 may be disposed in the sub-word driver region 104 shown in FIG. 3. The operation of the first word line driving circuit 221 will be described below.

Figure 9:
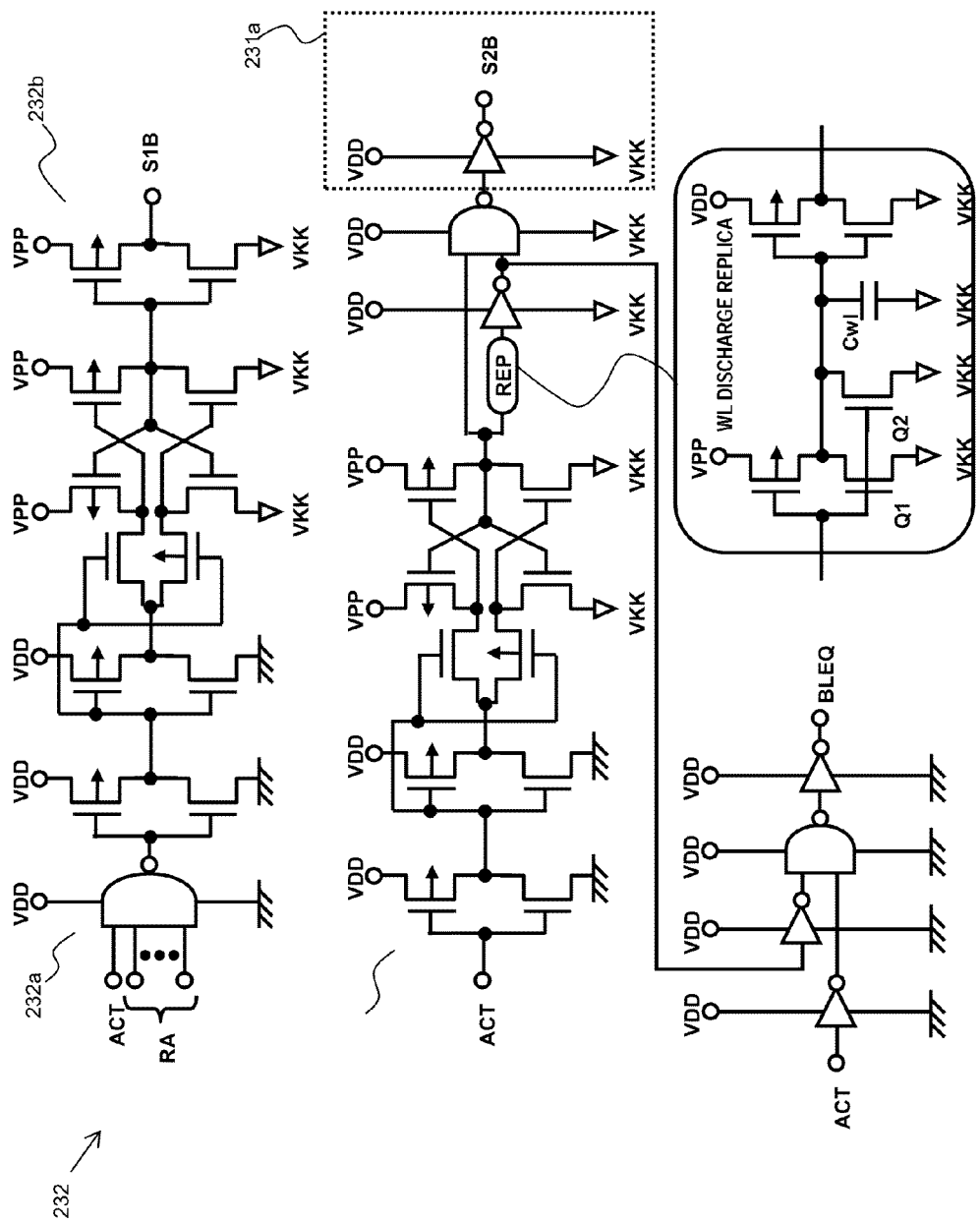
FIG. 9 is a circuit diagram showing an example of a control circuit of the first word line driving circuit according to the first exemplary embodiment.
Figure 10:
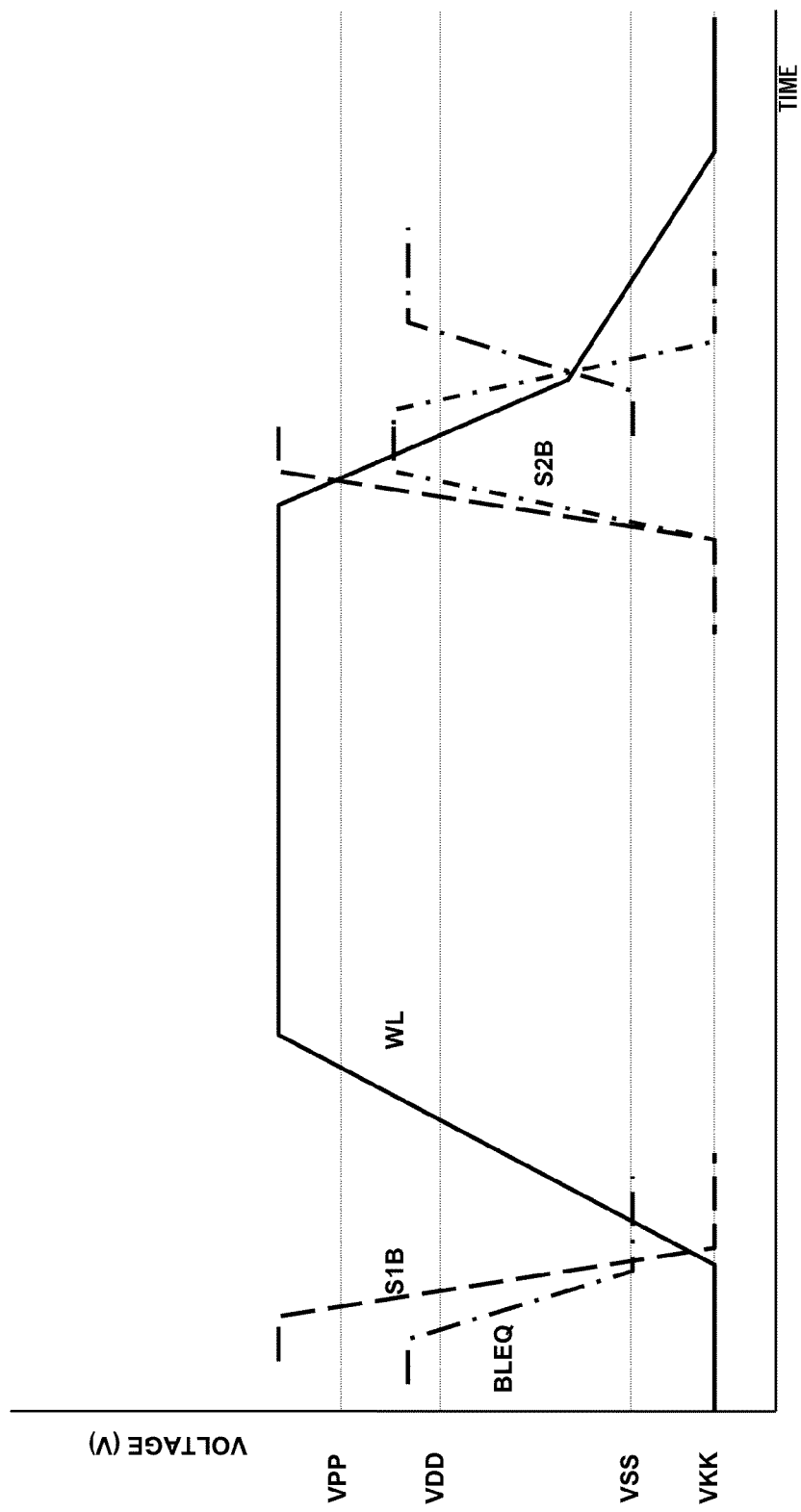
FIG. 10 is a schematic diagram showing an example of operation waveforms of the first word line driving circuit according to the first exemplary embodiment.

FIG. 9 is a circuit diagram showing an example of a control circuit of the first word line driving circuit according to the first exemplary embodiment. FIG. 10 is a schematic diagram showing an example of operation waveforms of the first word line driving circuit according to the first exemplary embodiment. In FIG. 9, a section surrounded by the broken line, i.e., a driver circuit (a first control unit) for a word line reset signal (a third control signal) S2B, is preferably disposed in the cross region 105 shown in FIG. 3. It is more preferred that only the driver circuit 231a in the final stage (a first circuit unit of the first control unit) of the driver circuit for the word line reset signal S2B be disposed in the cross region 105 shown in FIG. 3. Other section shown in FIG. 9, a second control unit 232, is preferably disposed in the outside of the array area such as the row decoder region 213 shown in FIG. 3 and the peripheral circuit region 211 shown in FIG. 2.

The second control unit 232 has a third circuit unit 232a that operates at a first power supply voltage between VSS and VDD and a fourth circuit unit 232b that operates at a second power supply voltage between VKK and VPP. The second control unit 232 supplies a word line driving signal S1B (a first control signal) to the first word line driving circuit 221. Moreover, the second control unit 232 supplies a control signal (a second control signal) to the driver circuit 231a in the final stage. Meanwhile, the first circuit unit 231a of the first control unit, which is the driver circuit in the final stage, operates at a third power supply voltage between VKK and VDD. The driver circuit 231a in the final stage receives the control signal from the second control unit 232 and supplies the word line reset signal (the third control signal) S2B to the first word line driving circuit 221. The first word line driving circuit 221 controls the active and inactive states of the word line according to potential changes of the word line driving signal S1B and the word line reset signal S2B.

By disposing the circuit (the first circuit unit of the first control unit) surrounded by the broken line in FIG. 9 in the cross region 105, the period of time before the driving of the word line can be reduced and an increase in the layout area can be restrained. In the sub-word driver region 104 shown in FIG. 3, the first word line driving circuits 221 shown in FIG. 8 as many as the number of the word lines are disposed. Further, in FIG. 3, in order to operate a total of five sub-word drivers disposed above and below the four memory cell mat regions 102 vertically arranged in a column simultaneously, the control signals for these drivers must be supplied simultaneously to the five sub-word driver regions 104. As described, since a plurality of the first word line driving circuits 221 are connected to the driver 231a (the first circuit unit of the first control unit) in the final stage in the control circuit of the word line driving circuit, a load capacity becomes heavy. Hypothetically, if the driver 231a in the final stage of the control circuit of the word line driving circuit is disposed in the row decoder region 213, the waveform thereof would be greatly delayed due to a wiring resistance and load capacity. According to the present disclosure, by using only the driver 231a in the final stage as a buffer and disposing it in each cross region 105, the load can be dispersed and a signal delay caused by the wiring resistance and load capacity can be prevented. Further, the cross region 105 can be utilized effectively.

In the activation of the word line, when the internal active signal ACT is controlled to go to a high level upon the reception of the active command signal, the bit line equalizing signal BLEQ is controlled to go to a low level. Next, the word line driving signal S1B corresponding to a word line selected by the row address RA is controlled to go from the boosting potential VPP to the negative potential VKK, and the word line WL is driven from VKK to VPP. The word line reset signal S2B maintains VKK even when the internal active signal ACT is driven to the high level.

In the deactivation of the word line, when the internal active signal ACT is controlled to go to a low level upon the reception of the precharge command signal, the first interval of the word line reset period begins. The word line driving signal S1B is driven to VPP, the word line reset signal S2B are driven to the power supply potential VDD, and the word line is rapidly reset by two transistors, first and second nMOS transistors Q1 and Q2.

After the delay time of a WL discharge replica monitoring the discharge speed of the word line has elapsed and the word line reset period enters into the second interval, since that the word line reset signal S2B goes to VKK and the second nMOS transistor Q2 turns off, the word line is slowly reset by one transistor, which is the first nMOS transistor Q1, the bit line equalizing signal BLEQ is controlled to go to a high level, and the equalization of the bit lines is started.

Here, since the same MOS transistors Q1 and Q2 are used in the WL discharge replica so that the characteristic variations of the two transistors (the first and the second nMOS transistors Q1 and Q2) in the first word line driving circuit 221 are monitored, it becomes possible to control the time duration of the first interval in the word line reset period to a predetermined timing even if the process, voltage, and temperature vary. In order to set the time duration of the first interval in the word line reset period, a predetermined value is set as a capacitance Cw1.

According to the present exemplary embodiment, by decreasing the deactivation speed in the second interval so that it is slower than the deactivation speed in the first interval, the slope of the word line reset waveform can essentially be made gentler. In other words, the pumping efficiency α can be reduced. As a result, the information surrounding a selected word line can be protected.

According to the present exemplary embodiment, since the deactivation of the word line is performed at only one type of voltage, VKK, an increase in the memory cell area can be restrained and the degree of freedom in designing the operation waveform of the word line deactivation can be increased.

According to the present exemplary embodiment, the potential of the word line can be decreased in the first interval before the equalization of the bit line and the extension of the equalization period can be prevented.

Figure 11:
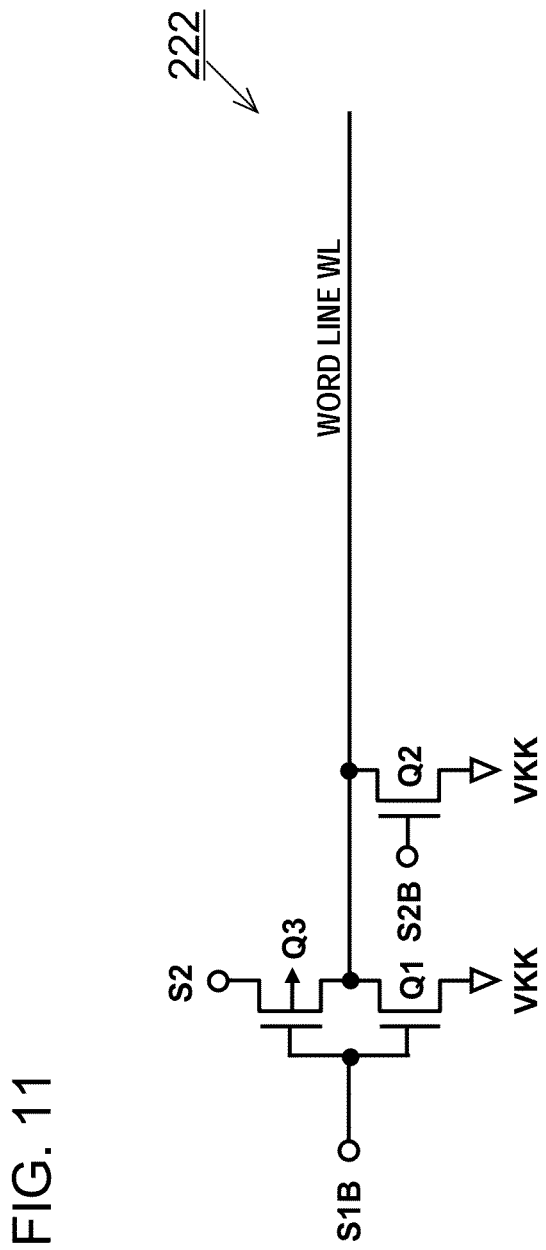
FIG. 11 is a circuit diagram showing an example of a second word line driving circuit in a semiconductor device according to a second exemplary embodiment of present disclosure.

Next, a semiconductor device according to a second exemplary embodiment of the present disclosure will be described. FIG. 11 is a circuit diagram showing an example of a second word line driving circuit in the semiconductor device of present disclosure. In the second exemplary embodiment, the second word line driving circuit 222 shown in FIG. 11 is used, instead of the first word line driving circuit shown in FIG. 8 in the first exemplary embodiment. The configuration of the second word line driving circuit 222 is the same as that of the first word line driving circuit 221, however, the second word line driving circuit 222 differs from the first word line driving circuit 221 in that a word line driving signal S2 is supplied, instead of the boosting power supply VPP. This configuration is used in a hierarchical word line scheme. The second word line driving circuit 222 can be disposed in the sub-word driver region 104 shown in FIG. 3. The operation of the second word line driving circuit 222 will be described below.

Figure 12:
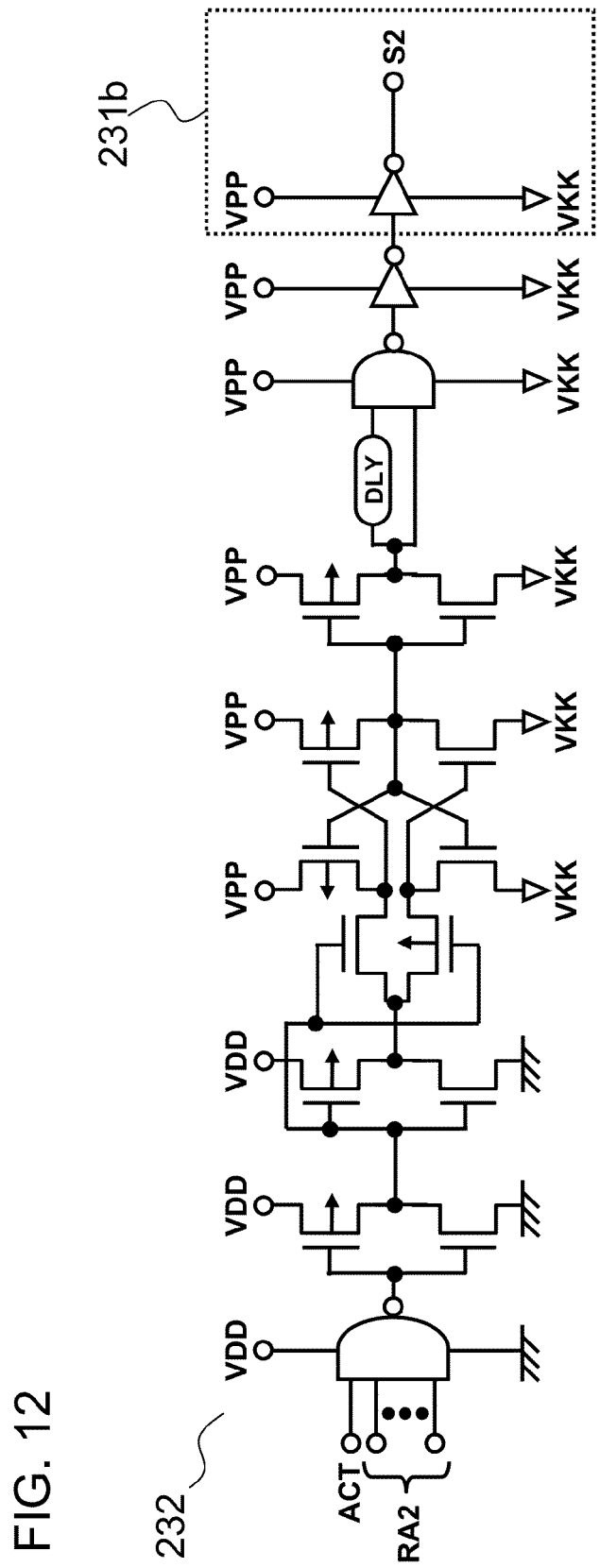
FIG. 12 is a circuit diagram showing an example of a first control circuit of the second word line driving circuit according to the second exemplary embodiment.
Figure 13:
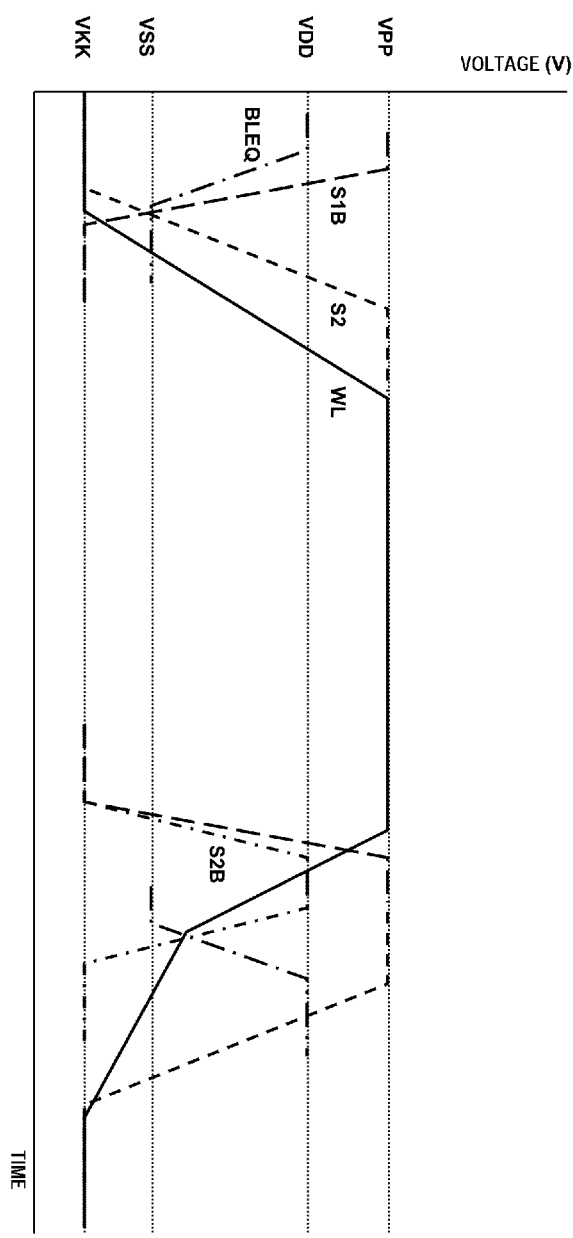
FIG. 13 is a schematic diagram showing an example of operation waveforms of the second word line driving circuit according to the second exemplary embodiment.

FIG. 12 is a circuit diagram showing an example of a first control circuit of the second word line driving circuit according to the second exemplary embodiment. FIG. 13 is a schematic diagram showing an example of operation waveforms of the second word line driving circuit according to the second exemplary embodiment. In the first control circuit of the second word line driving circuit, as far as the bit line equalizing signal BLEQ, the first word line driving signal S1B, and the word line reset signal S2B are concerned, the same signals as those shown in FIG. 9 can be used. In the second word line driving circuit 222, the word lines are hierarchically selected by the first word line driving signal (the first control signal) S1B and the second word line driving signal (the fifth control signal) S2.

It is preferred that a section surrounded by the broken line in FIGS. 12 and 9, i.e., a driver circuit for the second word line driving signal, be disposed in the cross region 105 shown in FIG. 3. It is further preferred that only the driver circuit 231b in the final stage (a second circuit unit of the first control unit) out of driver circuits for the second word line driving signal be disposed in the cross region 105 shown in FIG. 3. Other section shown in FIG. 12 (the second control unit 232) is preferably disposed in the outside of the array area such as the row decoder region 213 shown in FIG. 3 and the peripheral circuit region 211 shown in FIG. 2, as the second control unit 232 shown in FIG. 9.

The second circuit unit 231b of the first control unit, which is the driver circuit in the final stage, operates at the second power supply voltage between VKK and VPP. The second circuit unit 231b receives a control signal (a fourth control signal) from the second control unit 232 and supplies the second word line driving signal (the fifth control signal) S2 to the second word line driving circuit 222. The second word line driving circuit 222 controls the active and inactive states of the word line according to potential changes of the word line driving signal (the first control signal) S1B, the word line reset signal (the third control signal) S2B, and the second word line driving signal (the fifth control signal) S2.

In the activation of the word line, when the internal active signal ACT is controlled to go to a high level upon the reception of the active command signal, the bit line equalizing signal BLEQ is controlled to go to a low level. Next, the first word line driving signal S1B is controlled to go from the boosting potential VPP to the negative potential VKK. The second word line driving signal S2 selected by an address RA2, which is a part of the row address RA, is driven from VKK to VPP, and the word line WL is driven from VKK to VPP. A difference from the control circuit shown in FIG. 9 here is that the first word line driving signal S1B is selected by parts of the row address RA excluding RA2 in order to hierarchically select the word line. The word line reset signal S2B maintains VKK even when the internal active signal ACT is driven to the high level.

In the deactivation of the word line, when the internal active signal ACT is controlled to go to a low level upon the reception of the precharge command signal, the first interval of the word line reset period begins. The word line driving signal S1B is driven to VPP, and the word line reset signal S2B is driven to the power supply potential VDD, and the word line is rapidly reset by the two transistors, which are the first and the second nMOS transistors Q1 and Q2. After the delay time of the WL discharge replica monitoring the discharge speed of the word line has elapsed and the word line reset period enters into the second interval, since the word line reset signal S2B goes to VKK and the second nMOS transistor Q2 turns off, the word line is slowly reset by one transistor, which is the first nMOS transistor Q1, the bit line equalizing signal BLEQ is controlled to go to a high level, and the equalization of the bit line is started. The second word line driving signal S2 goes back to VKK thereafter.

Other modes in the second exemplary embodiments may be the same as in the first exemplary embodiment.

Figure 14:
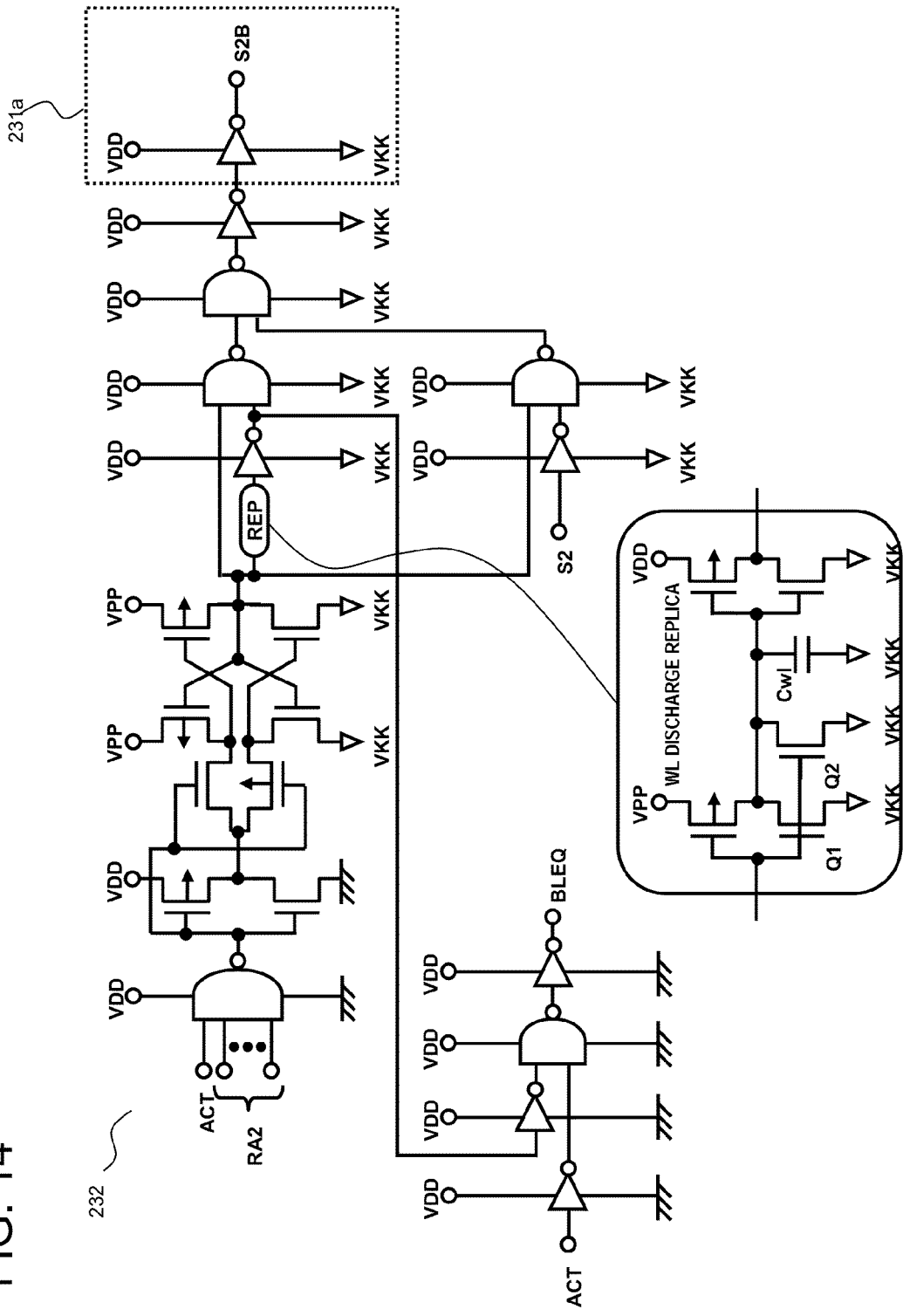
FIG. 14 is a circuit diagram showing an example of a second control circuit of a second word line driving circuit according to a third exemplary embodiment of the present disclosure.
Figure 15:
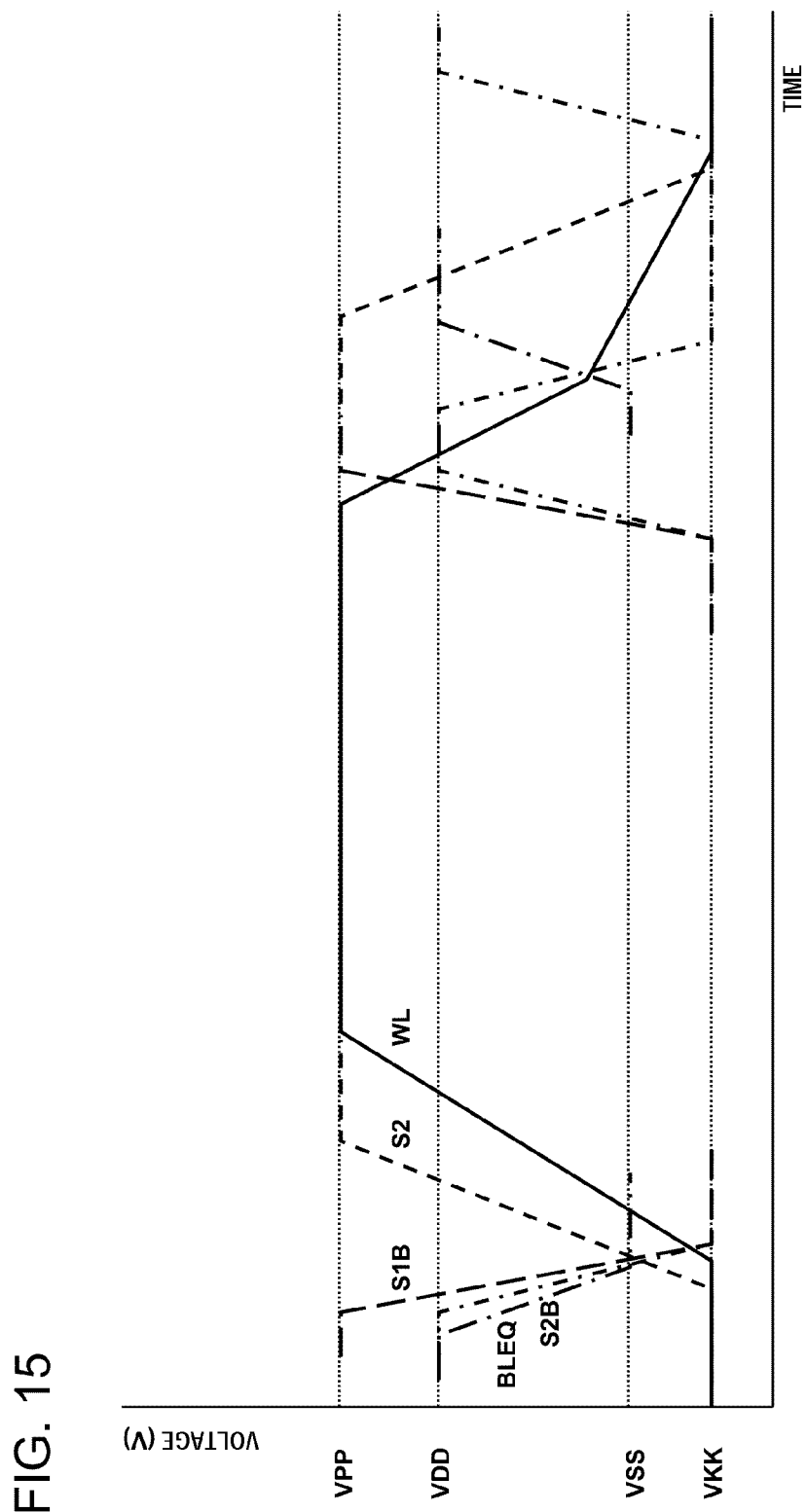
FIG. 15 is a schematic diagram showing an example of operation waveforms of the second word line driving circuit according to the third exemplary embodiment.

Next, a semiconductor device according to a third exemplary embodiment of the present disclosure will be described. FIG. 14 is a circuit diagram showing an example of a second control circuit of the second word line driving circuit according to the third exemplary embodiment of present disclosure. FIG. 15 is a schematic diagram showing an example of operation waveforms of the second word line driving circuit according to the third exemplary embodiment. In the third exemplary embodiment, the second control circuit of the second word line driving circuit shown in FIG. 14 is used instead of a part (excluding the S1B circuit) of the first control circuit of the second word line driving circuit, shown in FIG. 9, according to the second exemplary embodiment. In the third exemplary embodiment, the circuit shown in FIG. 12 can be used as the S2 circuit. In a combination in which the first word line driving signal S1B is selected and the second word line driving signal S2 is unselected in a hierarchical word line scheme, the unselected word line is prevented from going into a floating state in the third exemplary embodiment.

It is preferred that a section surrounded by the broken line in FIG. 14, i.e., a driver circuit for the word line reset signal S2B, be disposed in the cross region 105 shown in FIG. 3. It is further preferred that only the driver circuit in the final stage out of driver circuits for the word line reset signal S2B be disposed in the cross region 105 shown in FIG. 3. Other section shown in FIG. 14 is preferably disposed in the outside of the array area such as the row decoder region 213 shown in FIG. 3 and the peripheral circuit region 211 shown in FIG. 2.

Among the operation waveforms shown in FIG. 15, only the waveform of the word line reset signal S2B is different from that in the operation waveforms shown in FIG. 13; therefore, an explanation will be made on this point and other explanations will be omitted. As shown in FIG. 15, the word line reset signal S2B is controlled to be at a high level during the precharge period in which the internal active signal ACT is at a low level. When being selected by the internal active signal ACT and the row address RA2, the signal is controlled to go to a low level before the word line is selected, and the operation thereafter is the same as FIG. 13. Further, during the precharge period in which the internal active signal ACT is controlled to be at a low level, the word line reset signal S2B goes back to a high level. Meanwhile, in a case of an unselected word line (not shown in the drawing) not selected by the internal active signal ACT and the row address RA2, since the word line driving signal S2 maintains the low level, the word line reset signal S2B maintains the high level. As a result, the unselected word line can be prevented from going into a floating state.

Other modes in the third exemplary embodiments are the same as in the first and the second exemplary embodiments.

Figure 16:
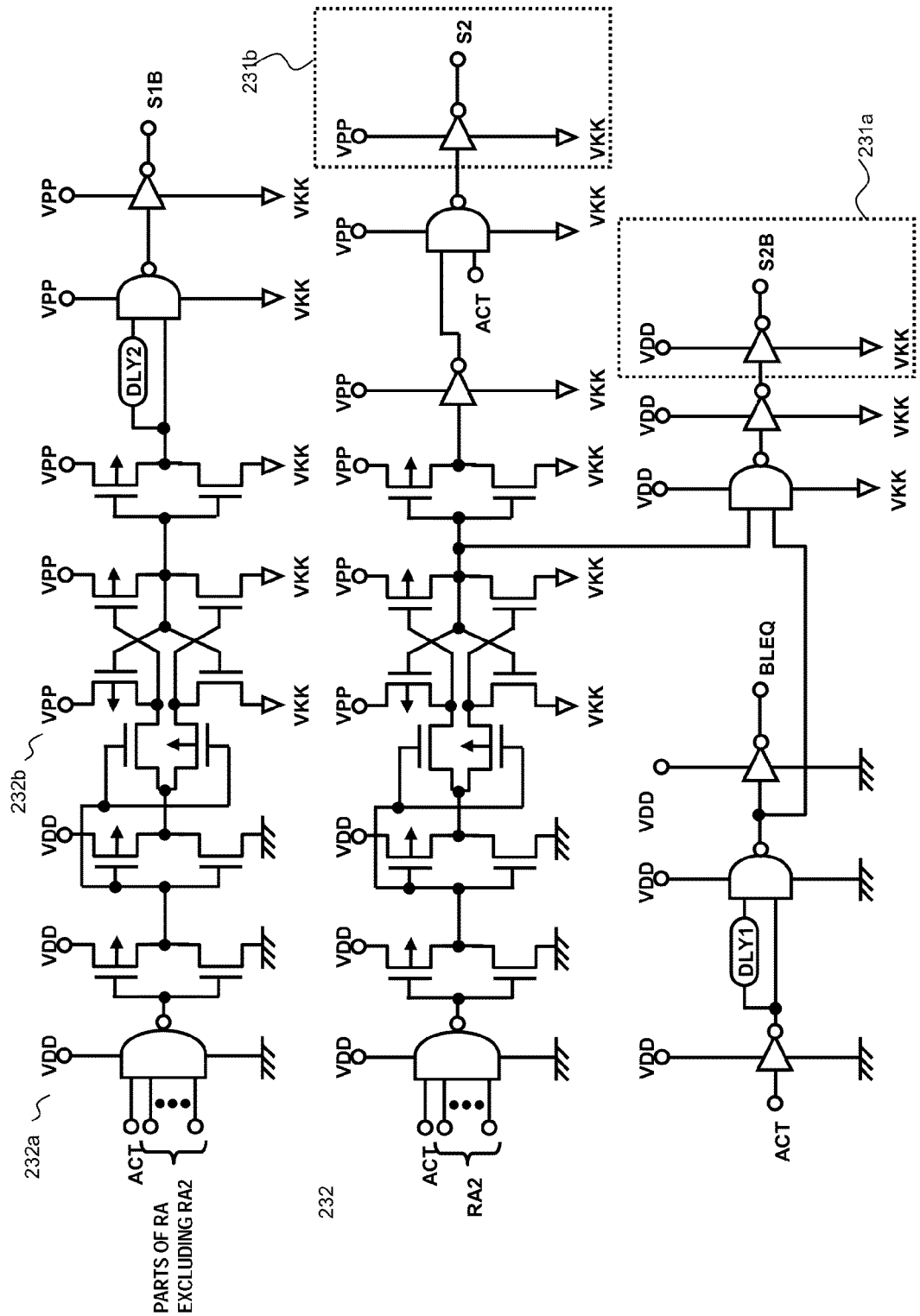
FIG. 16 is a circuit diagram showing an example of a third control circuit of a second word line driving circuit according to a fourth exemplary embodiment.
Figure 17:
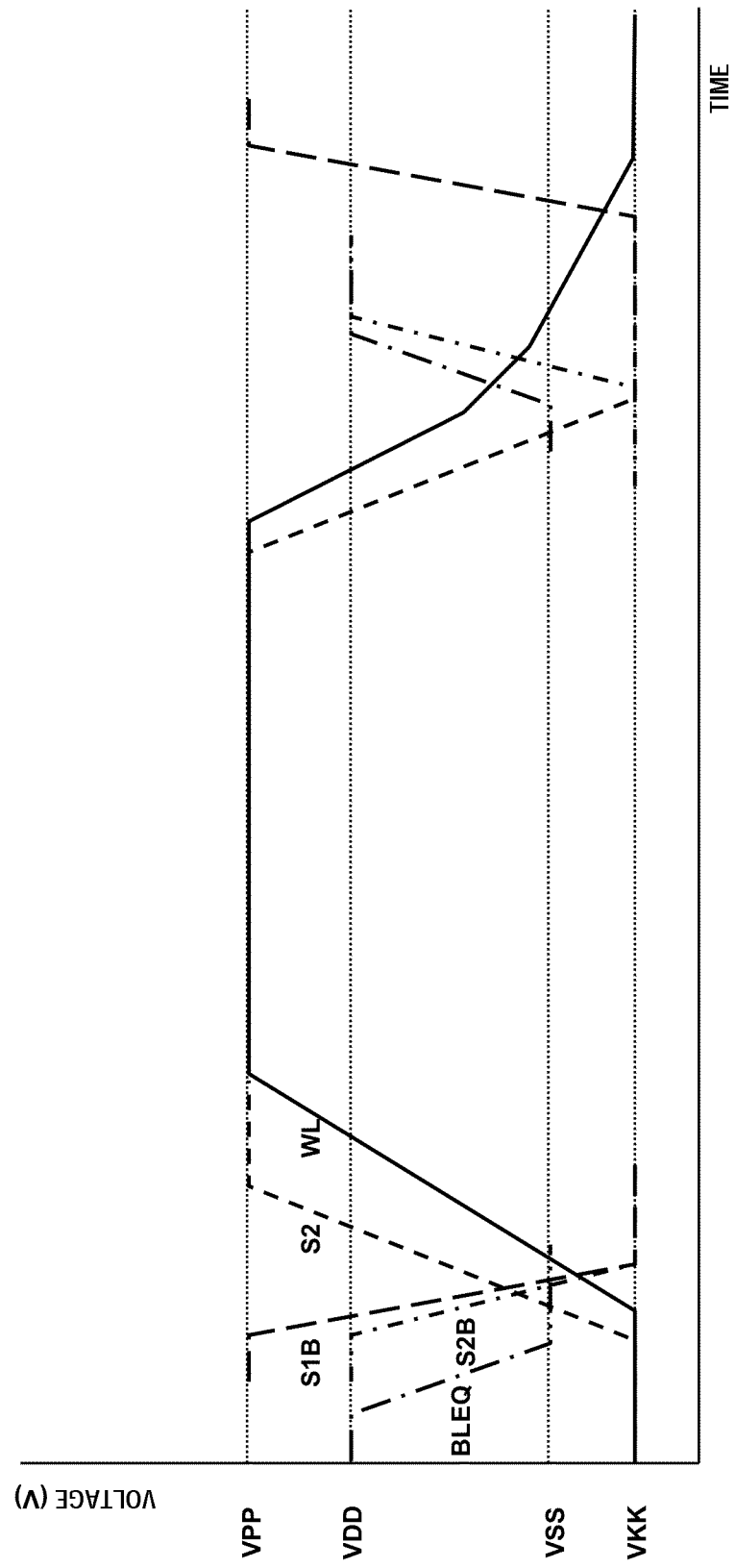
FIG. 17 is a schematic diagram showing an example of operation waveforms of the second word line driving circuit according to the fourth exemplary embodiment.

Next, a semiconductor device according to a fourth exemplary embodiment of the present disclosure will be described. FIG. 16 is a circuit diagram showing an example of a third control circuit of the second word line driving circuit according to the fourth exemplary embodiment of present disclosure. FIG. 17 is a schematic diagram showing an example of operation waveforms of the second word line driving circuit according to the fourth exemplary embodiment. In the fourth exemplary embodiment, the third control circuit of the second word line driving circuit shown in FIG. 16 is used instead of the first control circuit of the second word line driving circuit, shown in FIG. 12, according to the second exemplary embodiment. In the fourth exemplary embodiment, the word lines are hierarchically selected by the word line driving signal (the third control signal) S1B and the word line driving signal (the fifth control signal) S2.

It is preferred that sections surrounded by the broken line in FIG. 16, i.e., driver circuits for the word line reset signal S2B and the second word line driving signal S2, be disposed in the cross region 105 shown in FIG. 3. It is further preferred that only the driver circuits (the first circuit unit 231a and the second circuit unit 231b of the first control unit) in the final stage out of driver circuits for the word line reset signal S2B and the second word line driving signal S2 be disposed in the cross region 105 shown in FIG. 3. Other section shown in FIG. 16 is preferably disposed in the outside of the array area such as the row decoder region 213 shown in FIG. 3 and the peripheral circuit region 211 shown in FIG. 2.

In the activation of the word line, when the internal active signal ACT is controlled to go to a high level upon the reception of the active command signal, the bit line equalizing signal BLEQ is controlled to go to a low level. Next, the first word line driving signal S1B is selected by parts of the row address RA excluding RA2 and controlled to go from the boosting potential VPP to the negative potential VKK. The word line reset signal S2B is selected by the address RA2, which is a part of the row address RA, and is controlled to go from VDD to the negative potential VKK. Further, the second word line driving signal S2 selected by the address RA2, which is a part of the row address RA, is driven from VKK to VPP, and the word line WL is driven from VKK to VPP.

In the deactivation of the word line, when the internal active signal ACT is controlled to go to a low level upon the reception of the precharge command signal, the first interval of the word line reset period begins. First, the second word line driving signal S2 is driven from the boosting potential VPP to the negative potential VKK. At this time, since the first word line driving signal (the first control signal) S1B maintains the negative potential VKK, a pMOS transistor Q3 shown in FIG. 11 is turned on and the potential of the word line is discharged toward the VKK side via Q3 and rapidly decreases. Here, since the gate voltage of Q3 is VKK, the slope of the potential of the word line becomes smoother as the potential gets closer to a threshold voltage of VKK+Q3 and it never goes below the threshold voltage of VKK+Q3.

When a delay time DLY1 has elapsed after the internal active signal ACT is controlled to go to the low level, the word line reset period enters into the second interval, the bit line equalizing signal BLEQ is controlled to go to a high level, and the equalization of the bit line is started. As described above, since the potential of the word line never goes below the threshold voltage of VKK+Q3 in the first interval of the word line reset period, the potential of the word line does not have to be monitored during the delay time DLY1, and the circuit can be simplified as a result. Next, the word line reset signal S2B is controlled to go from VKK to VDD, and the potential of the word line is slowly discharged to VKK via the second nMOS transistor Q2. Finally, the first word line driving signal S1B is controlled to go from the negative VKK to the boosting potential VPP.

In the fourth exemplary embodiment, modes other than stated above can be the same as in the first to the third exemplary embodiments.

Figure 18:
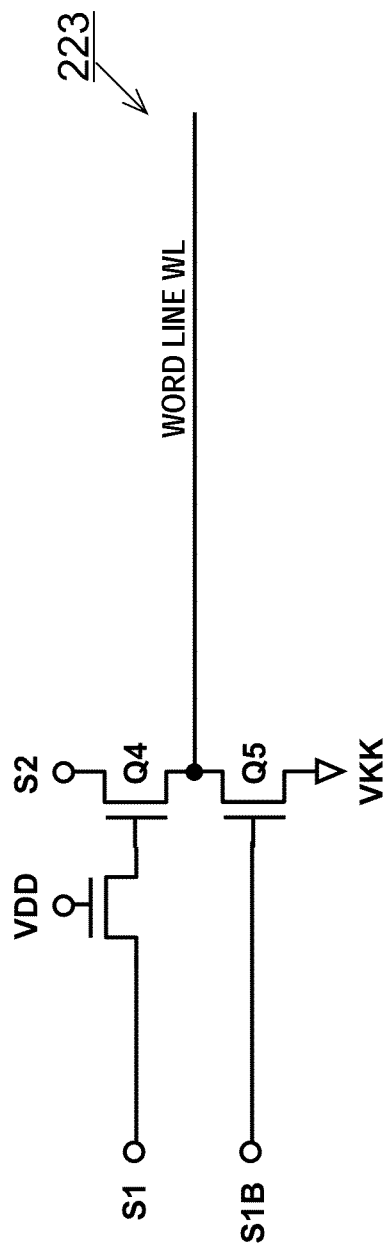
FIG. 18 is a circuit diagram showing an example of a control circuit of a third word line driving circuit according to a fifth exemplary embodiment.

Next, a semiconductor device according to a fifth exemplary embodiment of the present disclosure will be described. FIG. 18 is a circuit diagram showing an example of a third word line driving circuit in the semiconductor device of present disclosure. In the fifth exemplary embodiment, the third word line driving circuit 223 shown in FIG. 18 is used instead of the first and the second word line driving circuits, shown in FIGS. 8 and 11, according to the first to the fourth exemplary embodiments. The third word line driving circuit 223 shown in FIG. 18 is of the NMOS type and can also be used in a hierarchical word line scheme. The third word line driving circuit 223 can be disposed in the sub-word driver region 104 shown in FIG. 3. The operation of the third word line driving circuit 223 will be described below.

Figure 19:
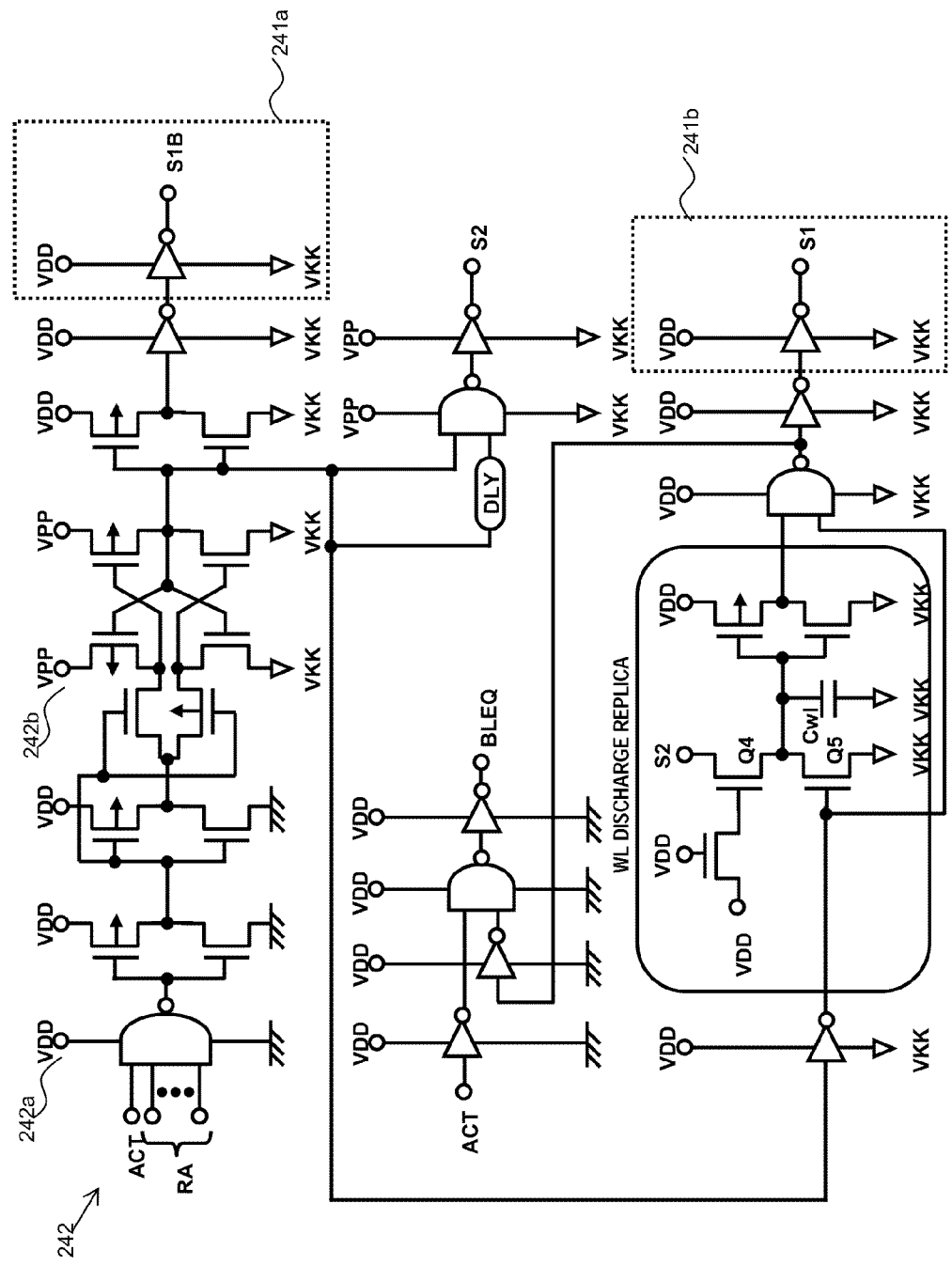
FIG. 19 is a circuit diagram showing an example of a control circuit of the third word line driving circuit according to the fifth exemplary embodiment.
Figure 20:
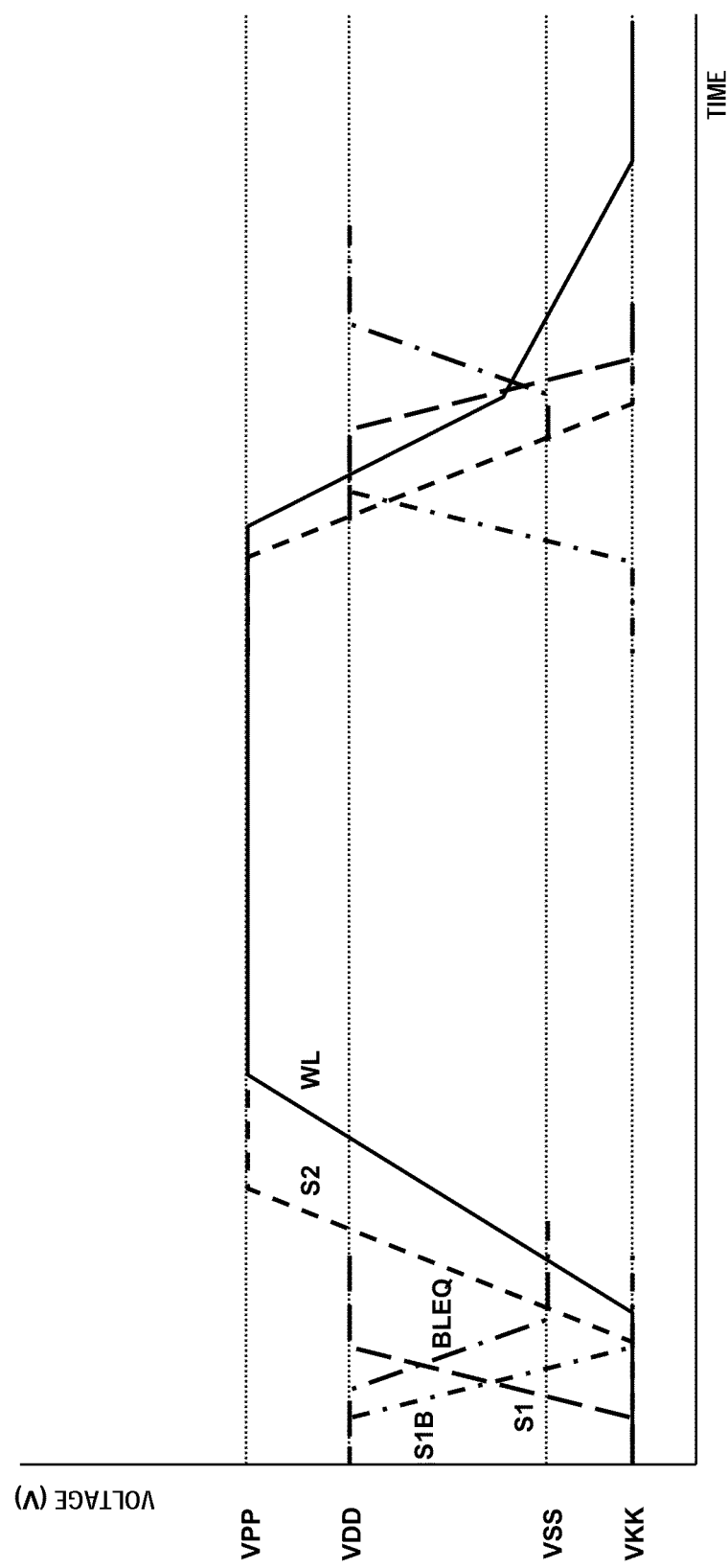
FIG. 20 is a schematic diagram showing an example of operation waveforms of the third word line driving circuit according to the fifth exemplary embodiment.

FIG. 19 is a circuit diagram showing an example of a control circuit of the third word line driving circuit according to the fifth exemplary embodiment. FIG. 20 is a schematic diagram showing an example of operation waveforms of the third word line driving circuit according to the fifth exemplary embodiment. It is preferred that sections surrounded by the broken line in FIG. 19, i.e., driver circuits for the word line reset signal (the third control signal) S1B and a first word line driving signal (a fifth control signal) S1, be disposed in the cross region 105 shown in FIG. 3. It is further preferred that only the driver circuits 241a and 241b (the first circuit unit and the second circuit unit of the first control unit) in the final stage out of driver circuits for the word line reset signal S1B and the first word line driving signal S1 be disposed in the cross region 105 shown in FIG. 3. Other section (a second control unit 242) shown in FIG. 19 is preferably disposed in the outside of the array area such as the row decoder region 213 shown in FIG. 3 and the peripheral circuit region 211 shown in FIG. 2.

The second control unit 242 has a third circuit unit 242a that operates at the first power supply voltage between VSS and VDD, and a fourth circuit unit 242b that operates at the second power supply voltage between VKK and VPP. The second control unit 242 supplies the second word line driving signal (the first control signal) S2 to the third word line driving circuit 223. Further, the second control unit 242 also supplies control signals (second and fourth control signals) to the driver circuits 241a and 241b in the final stage. Meanwhile, the first circuit unit 241a and the second circuit unit 241b of the first control unit, which are the driver circuits in the final stage, operate at the third power supply voltage between VKK and VDD. The driver circuits 241a and 241b in the final stage receive the control signals from the second control unit 242 and supply the word line reset signal (the third control signal) S1B and the first word line driving signal (the fifth control signal) S1 to the third word line driving circuit 223. The third word line driving circuit 223 controls the active and inactive states of the word line according to potential changes of the word line reset signal S1B, the first word line driving signal S1, and the second word line driving signal S2.

In the activation of the word line, when the internal active signal ACT is controlled to go to a high level upon the reception of the active command signal, the word line reset signal S1B is controlled to go to a low level, and the first word line driving signal S1 is controlled to go to a high level. Next, the bit line equalizing signal BLEQ is controlled to go to a low level, then the second word line driving signal (the first control signal) S2 is driven from VKK to VPP, and the word line WL is driven from VKK to VPP.

In the deactivation of the word line, when the internal active signal ACT is controlled to go to a low level upon the reception of the precharge command signal, the first interval of the word line reset period begins. The second word line driving signal S2 is driven to VKK, and the word line reset signal S1B is driven to a high level. At this time, since the first word line driving signal S1 still maintains the high level, the word line is rapidly reset by two transistors, which are fourth and fifth nMOS transistors Q4 and Q5. After the delay time of the WL discharge replica monitoring the discharge speed of the word line has elapsed and the word line reset period enters into the second interval, since the first word line driving signal S1 goes to VKK and the fourth nMOS transistor Q4 turns off, the word line is slowly reset by one transistor, which is the fifth nMOS transistor Q5, the bit line equalizing signal BLEQ is controlled to go to a high level, and the equalization of the bit line is started.

Here, since the same MOS transistors Q4 and Q5 are used in the WL discharge replica so that the characteristic variations of the two transistors (the fourth and the fifth nMOS transistors Q4 and Q5) in the third word line driving circuit 223 shown in FIG. 18 are monitored, it becomes possible to control the time duration of the first interval in the word line reset period to a predetermined timing even if the process, voltage, and temperature vary. In order to set the time duration of the first interval in the word line reset period, a predetermined value is set as the capacitance Cw1.

In the fifth exemplary embodiment, modes other than stated above can be the same as in the first exemplary embodiments.

Figure 21:
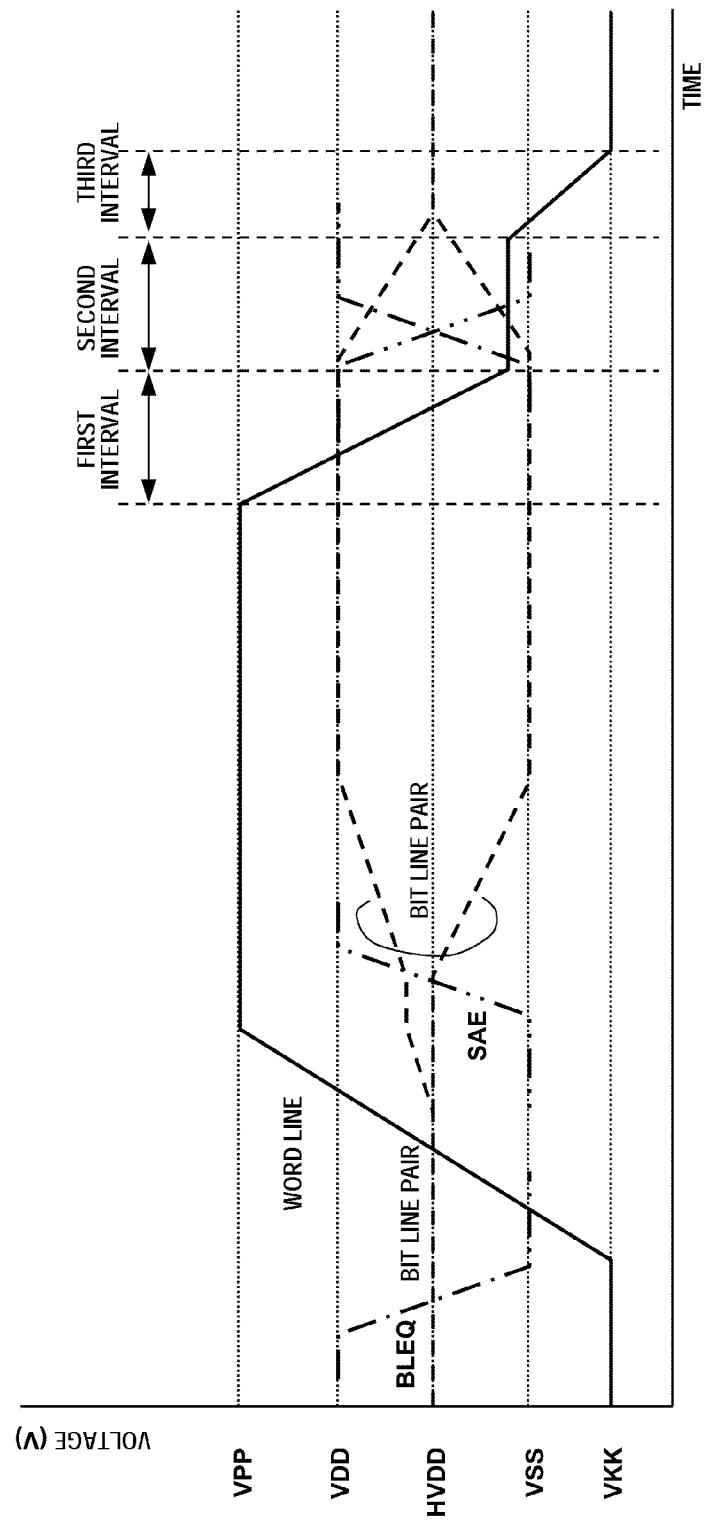
FIG. 21 is a schematic diagram showing an example of waveforms of a word line and a bit line pair in a semiconductor device according to a sixth exemplary embodiment of the present disclosure.

Next, a semiconductor device according to a sixth exemplary embodiment of the present disclosure will be described. FIG. 21 is a schematic diagram showing an example of waveforms of the word line and the bit line pair in the semiconductor device according to the sixth exemplary embodiment of the present disclosure. The sixth exemplary embodiment differs from the first to the fifth exemplary embodiments in that, when the word line is reset upon the reception of the precharge command signal, the word line is rapidly reset in the first interval and is maintained at an intermediate potential for a predetermined period of time in the second interval, and the equalization of the complementary bit line pair starts while the word line is maintained at the intermediate potential in the second interval. The word line is reset to VKK from the intermediate potential in a third interval thereafter.

Figure 22:
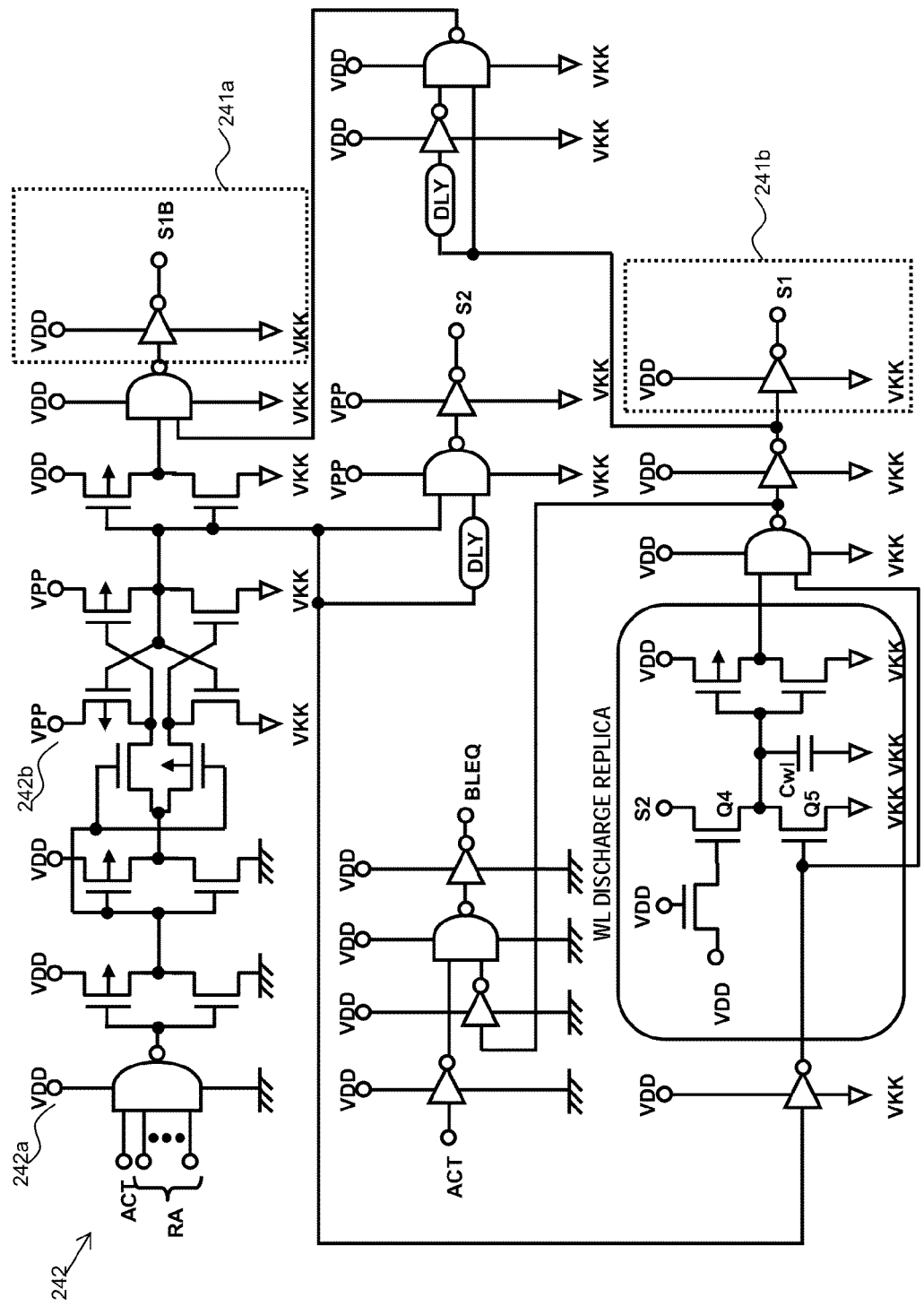
FIG. 22 is a circuit diagram showing an example of a control circuit of a third word line driving circuit according to the sixth exemplary embodiment.
Figure 23:
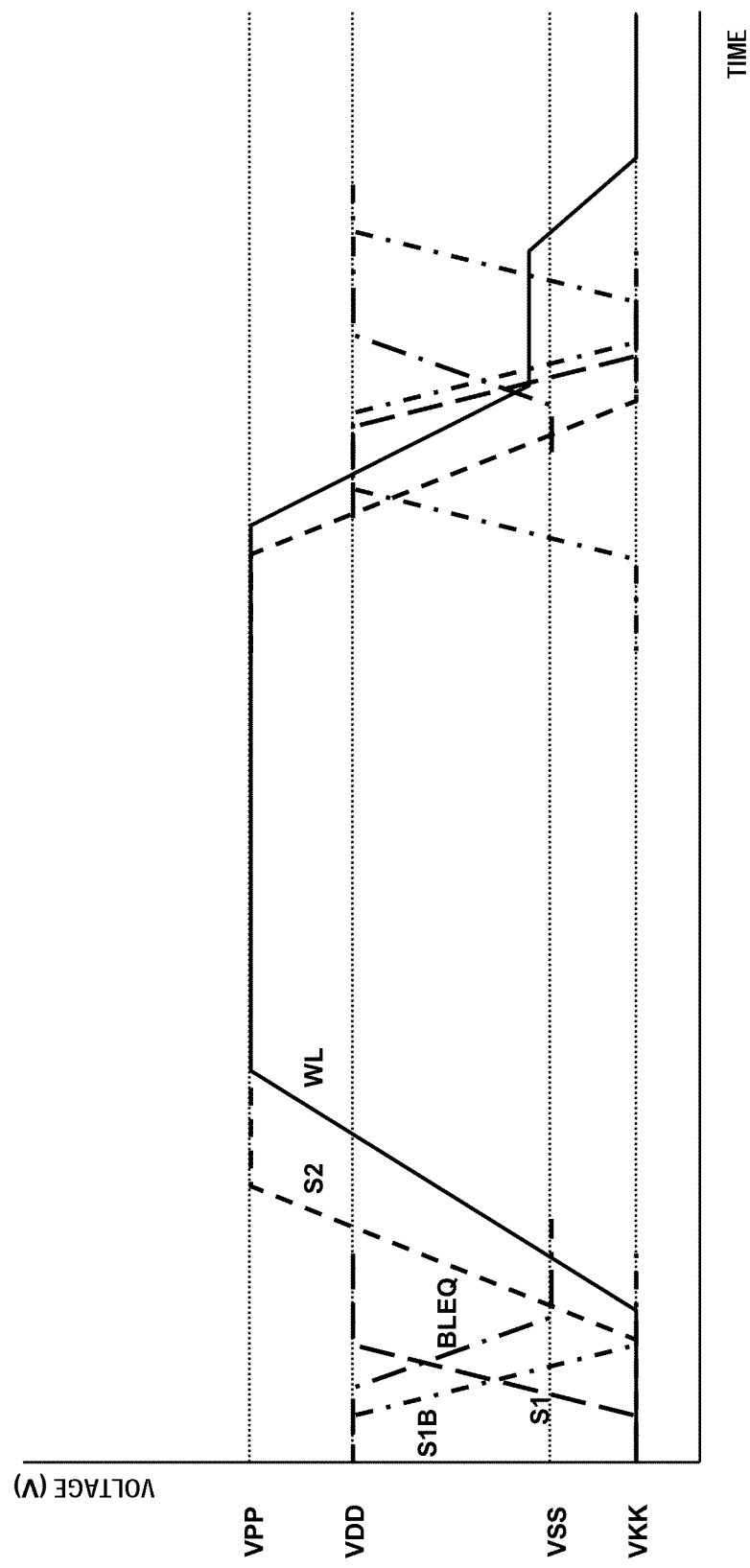
FIG. 23 is a schematic diagram showing an example of operation waveforms of the third word line driving circuit according to the sixth exemplary embodiment.

FIG. 22 is a circuit diagram showing an example of a control circuit of the third word line driving circuit according to the sixth exemplary embodiment. FIG. 23 is a schematic diagram showing an example of operation waveforms of the third word line driving circuit according to the sixth exemplary embodiment. It is preferred that sections surrounded by the broken line in FIG. 22, i.e., driver circuits for the word line reset signal (the third control signal) S1B and the word line driving signal (the fifth control signal) S1, be disposed in the cross region 105 shown in FIG. 3. It is further preferred that only the driver circuits (the first and the second circuit units of the first control unit) 241a and 241b in the final stage out of driver circuits for the word line reset signal S1B and the word line driving signal S1 be disposed in the cross region 105 shown in FIG. 3. Other section (the second control unit 242) shown in FIG. 22 is preferably disposed in the outside of the array area such as the row decoder region 213 shown in FIG. 3 and the peripheral circuit region 211 shown in FIG. 2.

In the activation of the word line, when the internal active signal ACT is controlled to go to a high level upon the reception of the active command signal, the word line reset signal S1B is controlled to go to a low level, and the first word line driving signal S1 is controlled to go to a high level. Next, the bit line equalizing signal BLEQ is controlled to go to a low level, then the second word line driving signal S2 is driven from VKK to VPP, and the word line WL is driven from VKK to VPP.

In the deactivation of the word line, when the internal active signal ACT is controlled to go to a low level upon the reception of the precharge command signal, the first interval of the word line reset period begins. The second word line driving signal S2 is driven to VKK, and the word line reset signal S1B is driven to a high level. At this time, since the first word line driving signal S1 still maintains the high level, the word line is rapidly reset by two transistors, which are the fourth and the fifth nMOS transistors Q4 and Q5. After the delay time of the WL discharge replica monitoring the discharge speed of the word line has elapsed and the word line reset period enters into the second interval, since the first word line driving signal S1 and the word line reset signal S1B go to VKK, and the fourth and the fifth nMOS transistors Q4 and Q5 turns off, the word line is temporarily held at the intermediate potential, the bit line equalizing signal BLEQ is controlled to go to a high level, and the equalization of the bit lines are started. Then the word line reset signal S1B is driven to a high level again in the third interval, and the word line is slowly reset to VKK by one transistor, which is the fifth nMOS transistor Q5.

Here, since the same MOS transistors Q4 and Q5 are used in the WL discharge replica so that the characteristic variations of the two transistors (the fourth and the fifth nMOS transistors Q4 and Q5) in the third word line driving circuit 223 shown in FIG. 18 are monitored, it becomes possible to control the time duration of the first interval in the word line reset period to a predetermined timing even if the process, voltage, and temperature vary. In order to set the time duration of the first interval in the word line reset period, a predetermined value is set as the capacitance Cw1.

In the sixth exemplary embodiment, modes other than stated above can be the same as in the fifth exemplary embodiments.

It is apparent that the present disclosure is not limited to the above exemplary embodiments, but may be modified and changed without departing from the scope and spirit of the disclosure.

The semiconductor device of the present disclosure has been described by way of the above exemplary embodiments, however, it should be noted that any modification, change and improvement to the above exemplary embodiments may be included within the scope of the present disclosure and the basic technical art. Also it should be noted that any combination, replacement and/or selection of the disclosed and/or claimed elements, matters and/or items may be available.

It should be noted that other objects, features and aspects of the present disclosure will become apparent in the entire disclosure including the claims.

What is claimed is:

1. A semiconductor device comprising:
   first and second memory cell arrays arranged side by side in a first direction, each of said first and said second memory cell arrays comprising a memory cell mat that includes a word line and a bit line, a sub-word driver circuit that drives said word line, and a first control unit that controls said sub-word driver circuit; and
   a first region that is disposed between said first memory cell array and said second memory cell array, and that includes a second control unit that controls said sub-word driver circuit;
   wherein said first control unit has a first circuit unit;
   said second control unit includes a third circuit unit that operates at a first power supply voltage having a first power supply potential as a low potential side and a fourth circuit unit that operates at a second power supply voltage having a second power supply potential lower than said first power supply potential as a low potential side, supplies a first control signal to said sub-word driver circuit, and supplies a second control signal to said first circuit unit of said first control unit;
   said first circuit unit of said first control unit operates at a third power supply voltage having said second power supply potential as a low potential side without receiving said first power supply potential, receives said second control signal, and supplies a third control signal to said sub-word driver circuit; and
   said sub-word driver circuit receives said first control signal and said third control signal, and nonlinearly deactivates said word line of an active state.

2. The semiconductor device according to claim 1, wherein said sub-word driver circuit decreases a speed of deactivating said word line while said word line is being put into an inactive state.

3. The semiconductor device according to claim 2, wherein equalization of said bit line is started after the speed of deactivating said word line has changed.

4. The semiconductor device according to claim 1, wherein said first circuit unit of said first control unit changes a potential of said third control signal in an active state of said word line; said second control unit changes a potential of said first control signal in an active state of said word line; and said sub-word driver circuit starts the deactivation of said word line of an active state when at least one of potentials of said first control signal and said third control signal changes.

5. The semiconductor device according to claim 1, wherein
   said first control unit further has a second circuit unit that operates at said second power supply voltage;
   said second control unit further supplies a fourth control signal to said second circuit unit of said first control unit;
   said second circuit unit of said first control unit receives said fourth control signal and supplies a fifth control signal to said sub-word driver circuit; and
   said sub-word driver circuit receives said first control signal, said third control signal and said fifth control signal, and nonlinearly deactivates said word line of an active state.

6. The semiconductor device according to claim 1, wherein
   said first control unit further has a second circuit unit that operates at said third power supply voltage;
   said second control unit further supplies a fourth control signal to said second circuit unit of said first control unit;
   said second circuit unit of said first control unit receives said fourth control signal and supplies a fifth control signal to said sub-word driver circuit; and
   said sub-word driver circuit receives said first control signal, said third control signal and said fifth control signal, and nonlinearly deactivates said word line of an active state.

7. The semiconductor device according to claim 1, wherein said sub-word driver circuit has a plurality of transistors used to deactivate said word line, and changes a speed of deactivating said word line by changing the number of said transistors used to deactivate said word line.

8. A device comprising:
   a memory cell array including a plurality of word lines, a plurality of bit lines each intersecting the word lines and a plurality of memory cells each disposed at an associated one of intersections of the word and bit lines, each of the memory cells including a capacitor and a cell transistor connected in series between an associated one of the bit lines and a plate potential line, the cell transistor including a gate connected to an associated one of the word line;
   a driver circuit including a plurality of driver units each provided for an associated one of the word lines, each of the driver units including a first transistor connected between a first circuit node and the associated one of the word lines, and a second transistor connected between the associated one of the word lines and a second node, and a third transistor connected in parallel to the second transistor, the second and third transistors being rendered conductive to drive the associated one of the word lines from a selection level to an intermediate level at a first rate, and one of the second and third transistors being rendered nonconductive to drive the associated one of the word lines from the intermediate level to a non-selection level at a second rate; and
   a control circuit configured to control each of the driver units to drive the associated one of the word lines from the selection level to the intermediate level at the first rate and from the intermediated level to the non-selection level at the second rate, the intermediate level being between the selection and non-selection levels, and the first rate being greater than the second rate.

* * * * *